(12) United States Patent
Kubota et al.

(10) Patent No.: US 9,076,979 B2
(45) Date of Patent: Jul. 7, 2015

(54) ORGANIC ELECTROLUMINESCENT ELEMENT, LIGHTING FIXTURE, AND FOOD STORAGE DEVICE

(75) Inventors: Hirofumi Kubota, Osaka (JP); Varutt Kittichungchit, Osaka (JP); Hiroya Tsuji, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 43 days.

(21) Appl. No.: 14/006,415

(22) PCT Filed: Mar. 13, 2012

(86) PCT No.: PCT/JP2012/056351
§ 371 (c)(1),
(2), (4) Date: Sep. 20, 2013

(87) PCT Pub. No.: WO2012/128116
PCT Pub. Date: Sep. 27, 2012

(65) Prior Publication Data
US 2014/0009918 A1 Jan. 9, 2014

(30) Foreign Application Priority Data

Mar. 24, 2011 (JP) .................................. 2011-066563

(51) Int. Cl.
*H01L 51/54* (2006.01)
*F21W 131/305* (2006.01)
(Continued)

(52) U.S. Cl.
CPC .......... *H01L 51/52* (2013.01); *F21W 2131/305* (2013.01); *H01L 51/5044* (2013.01); *H01L 2251/5361* (2013.01); *F21V 33/0004* (2013.01)

(58) Field of Classification Search
CPC .......... A47F 3/00; A47F 3/001; F25D 27/00; F21W 2131/305405; H01L 51/5036–51/5044
USPC ................... 313/504; 362/126, 154; 428/690; 252/301.16
See application file for complete search history.

(56) References Cited

U.S. PATENT DOCUMENTS

| 6,528,188 B1 | 3/2003 | Suzuki et al. | |
| 2003/0170491 A1* | 9/2003 | Liao et al. | 428/690 |

(Continued)

FOREIGN PATENT DOCUMENTS

| JP | 2001-155860 | 6/2001 |
| JP | 3589960 | 11/2004 |

(Continued)

OTHER PUBLICATIONS

Machine translation of JP 2008-295534 A, retrieved Dec. 11, 2014.*
(Continued)

*Primary Examiner* — Anh Mai
*Assistant Examiner* — Steven Horikoshi
(74) *Attorney, Agent, or Firm* — Greenblum & Bernstein, P.L.C.

(57) ABSTRACT

The object of the present invention is to provide an organic electroluminescent element suitable for both food lighting at a low temperature and indoor lighting at room temperature. The organic electroluminescent element according to the present invention has such characteristics that a maximum of a general color rendering index Ra in a range of an element temperature of 5° C. to 60° C. is present in a range of the element temperature of 15° C. to 35° C. and that at least one of maxima of special color rendering indexes R10, R11, R12, and R13 in the range of the element temperature of 5° C. to 60° C. is present in a range of the element temperature of 5° C. to 35° C.

15 Claims, 8 Drawing Sheets

(51) Int. Cl.
*H01L 51/52* (2006.01)
*H01L 51/50* (2006.01)
*F21V 33/00* (2006.01)

(56) References Cited

U.S. PATENT DOCUMENTS

2005/0100760 A1* 5/2005 Yokoyama ............... 428/690
2009/0045736 A1* 2/2009 Kho et al. ............... 313/504
2009/0243467 A1* 10/2009 Shimizu et al. ........... 313/503

FOREIGN PATENT DOCUMENTS

| JP | 2007-309631 | | 11/2007 |
| JP | 2008-288396 | | 11/2008 |
| JP | 2008-295534 | | 12/2008 |
| JP | 2008295534 A | * | 12/2008 |
| JP | 2009-224274 | | 10/2009 |
| JP | 2010-129301 | | 6/2010 |

OTHER PUBLICATIONS

Iwashita et al., "Making Lighting Device Using Organic Light Emitting Diodes", The Journal of the Institute of Image Information and Television Engineers, vol. 64, No. 9, Sep. 1, 2010, pp. 1323-1326, together with a partial English language translation thereof.
Ide et al., "White OLED devices and processes for lighting applications", Proceedings of SPIE, vol. 7722, 2010, pp. 772202.1-772202.8.
International Search Report in PCT/JP2012/056351, mail date is Apr. 17, 2012.

* cited by examiner

US 9,076,979 B2

ORGANIC ELECTROLUMINESCENT ELEMENT, LIGHTING FIXTURE, AND FOOD STORAGE DEVICE

TECHNICAL FIELD

The present invention relates to an organic electroluminescent element, a lighting fixture including the organic electroluminescent element, and a food storage device including the lighting fixture.

BACKGROUND ART

Organic electroluminescent elements (organic light emitting diodes) are attracting intention as next-generation light sources that can be utilized as flat panel displays, backlights for liquid crystal display devices, light sources for lighting and the like, because of reasons such as being capable of surface emission at high luminance with a low voltage.

Patent Literature 1 discloses one example of conventional organic electroluminescent elements. In this organic electroluminescent element, a light emitting layer is constituted by a hole transporting light emitting layer in which a hole transporting material to which a first fluorescent material is added serves as a matrix, and an electron transporting light emitting layer in which an electron transporting material to which a second fluorescent material is added serves as a matrix. The hole transporting light emitting layer and the electron transporting light emitting layer are caused to emit light at the same time so that the color of light emitted from these light emitting layers is perceived as a mixed color, and both first fluorescent material of the hole transporting light emitting layer and second fluorescent material of the electron transporting light emitting layer are respectively made of two or more types of fluorescent materials such that the emission spectrum of light with a color emitted from the hole transporting light emitting layer is approximately the same as that of light with a color emitted from the electron transporting light emitting layer. The wavelengths of the peak in fluorescence of these two or more types of fluorescent material in a solid state are different from each other. The organic electroluminescent element disclosed in Patent Literature 1 is proposed from the point of view of preventing a chromaticity change in the color of emitted light that accompanies a change in the amount of applied current or the elapse of emission time.

CITATION LIST

Patent Literature

Patent Literature 1: JP 3589960 B

SUMMARY OF INVENTION

Technical Problem

However, the present inventors newly focused on and investigated the relationship between the temperature environment where a lighting fixture is used and the object to be illuminated therewith, which is a matter that has not been sufficiently investigated up to now, when organic electroluminescent elements are applied to lighting uses.

For example, in order to display or store food, cooked dishes or the like at a store, a food storage device such as a showcase or the like that is capable of storing food etc. at a low temperature around 5° C. is used for the purpose of suppressing bacteria growth and preventing food poisoning. A light source having a high specific special color rendering index is used as lighting in this food storage device in order to enhance the appearance of food and the like that are for sale. On the other hand, a light source having a high general color rendering index is preferred for indoor lighting.

Conventionally, a fluorescent lamp has been mainly used as such a light source. However, a fluorescent lamp has a narrow width of an emission spectrum, and therefore it is difficult to obtain various color rendering properties. Accordingly, fluorescent lamps having different color rendering properties have been developed for lighting use in a food storage device and indoor lighting use. Thus, there is a problem in that it is difficult to reduce the cost of light sources. Furthermore, since the value of the general color rendering index of a fluorescent lamp is low at about 80, it has not been possible to sufficiently improve the appearance of a lighting target in lighting use in a food storage device or indoor lighting use.

In view of this, if it is possible to obtain an organic electroluminescent element that has both color rendering properties capable of improving the appearance of food at a low temperature and a high general color rendering index at room temperature, the need to change the design of the organic electroluminescent element in accordance with the purpose of lighting is eliminated. Accordingly, it is possible to obtain highly versatile organic electroluminescent elements at low cost. Organic electroluminescent elements designed from such a point of view have not yet existed.

The present invention has been made in light of the above-described circumstances, and it is an object of the present invention to provide an organic electroluminescent element and a lighting fixture that are suitable for both food lighting at a low temperature and indoor lighting at room temperature, and to provide a food storage device that includes the lighting fixture and is capable of storing food at a low temperature and enhancing the appearance of the food.

Solution to Problem

The organic electroluminescent element in accordance with the present invention has such characteristics that a maximum of a general color rendering index Ra in a range of an element temperature of 5° C. to 60° C. is present in a range of the element temperature of 15° C. to 35° C. and that at least one of maxima of special color rendering indexes R10, R11, R12, and R13 in the range of the element temperature of 5° C. to 60° C. is present in a range of the element temperature of 5° C. to 35° C.

In a preferred aspect of the organic electroluminescent element in accordance with the present invention, at least one of the maxima of the special color rendering indexes R10, R11, R12, and R13 in the range of the element temperature of 5° C. to 60° C. is present in a range of the element temperature of 15° C. to 35° C.

In a preferred aspect of the organic electroluminescent element in accordance with the present invention, with regard to at least one of the general color rendering index Ra, and the special color rendering indexes R10, R11, R12, and R13, a proportion of a minimum to a maximum in a range of the element temperature of 5° C. to 25° C. is equal to 0.8 or more and a value thereof is equal to 70 or more.

In a preferred aspect of the organic electroluminescent element in accordance with the present invention, at the element temperature of 5° C., of the special color rendering index R13, the special color rendering index R11, the special color rendering index R10, and the special color rendering index R12, the special color rendering index R13 is the largest, followed by the special color rendering index R1, the special color rendering index R10, and the special color rendering index R12 in this order, and of the special color rendering index R13, the general color rendering index Ra, and the special color rendering index R12, the special color rendering index R13 is the largest, followed by the general color rendering index Ra, and the special color rendering index R12 in this order.

In a preferred aspect of the organic electroluminescent element in accordance with the present invention, at the element temperature of 5° C., of the special color rendering index R13, the special color rendering index R10, and the special color rendering index R12, the special color rendering index R13 is the largest, followed by the special color rendering index R10, and the special color rendering index R12 in this order. At the element temperature of 5° C., of the special color rendering index R13, the special color rendering index R11, and the special color rendering index R12, the special color rendering index R13 is the largest, followed by the special color rendering index R11, and the special color rendering index R12 in this order. At the element temperature of 5° C., of the special color rendering index R13, the general color rendering index Ra, and the special color rendering index R12, the special color rendering index R13 is the largest, followed by the general color rendering index Ra, and then the special color rendering index R12.

In a preferred aspect of the organic electroluminescent element in accordance with the present invention, with regard to values of u' and v' in a u', v' chromaticity diagram of a color of light emitted from the organic electroluminescent element in a direction identical to a direction in which multiple layers constituting the organic electroluminescent element are stacked, the value of u' decreases more and the value of v' increases more in a case where the element temperature is 5° C. than in a case where the element temperature is 25° C.

In a preferred aspect of the organic electroluminescent element in accordance with the present invention, a color temperature of light is higher in a case where the element temperature is 5° C. than in a case where the element temperature is 25° C.

In a preferred aspect of the organic electroluminescent element in accordance with the present invention, with regard to values of u' and v' in a u', v' chromaticity diagram of a color of light emitted from the organic electroluminescent element in a direction identical to a direction in which multiple layers constituting the organic electroluminescent element are stacked, the value of u' increases more and the value of v' increases more in a case where the element temperature is 5° C. than in a case where the element temperature is 25° C.

In a preferred aspect of the organic electroluminescent element in accordance with the present invention, a color temperature of light is lower in a case where the element temperature is 5° C. than in a case where the element temperature is 25° C.

In a preferred aspect of the organic electroluminescent element in accordance with the present invention, the organic electroluminescent element includes a plurality of light emitting layers designed to emit light in a green region. At least one of the plurality of light emitting layers contains a phosphorescent dopant.

In a preferred aspect of the organic electroluminescent element in accordance with the present invention, the organic electroluminescent element includes a red region light emitting layer designed to emit light in a red region, and a green region light emitting layer designed to emit light in a green region. The green region light emitting layer is placed on the red region light emitting layer and contains a phosphorescent dopant. The red region light emitting layer has a thickness less than a thickness of the green region light emitting layer.

In a preferred aspect of the organic electroluminescent element in accordance with the present invention, a rate of the thickness of the red region light emitting layer to the thickness of the green region light emitting layer is in a range of 2 to 15%.

In a preferred aspect of the organic electroluminescent element in accordance with the present invention, the organic electroluminescent element includes a first light emitting unit, a second light emitting unit, and an interlayer interposed between the first light emitting unit and the second light emitting unit.

The lighting fixture in accordance with the present invention includes the organic electroluminescent element.

The food storage device in accordance with the present invention includes a storage configured to store food and the lighting fixture configured to illuminate an interior of the storage.

Advantageous Effects of Invention

According to the present invention, it is possible to obtain an organic electroluminescent element and a lighting fixture that are suitable for both food lighting at a low temperature and indoor lighting at room temperature.

Also, according to the present invention, it is possible to obtain a food storage device that includes the lighting fixture and is capable of storing food at a low temperature and enhancing the appearance of the food.

DESCRIPTION OF EMBODIMENTS

Figure 1:
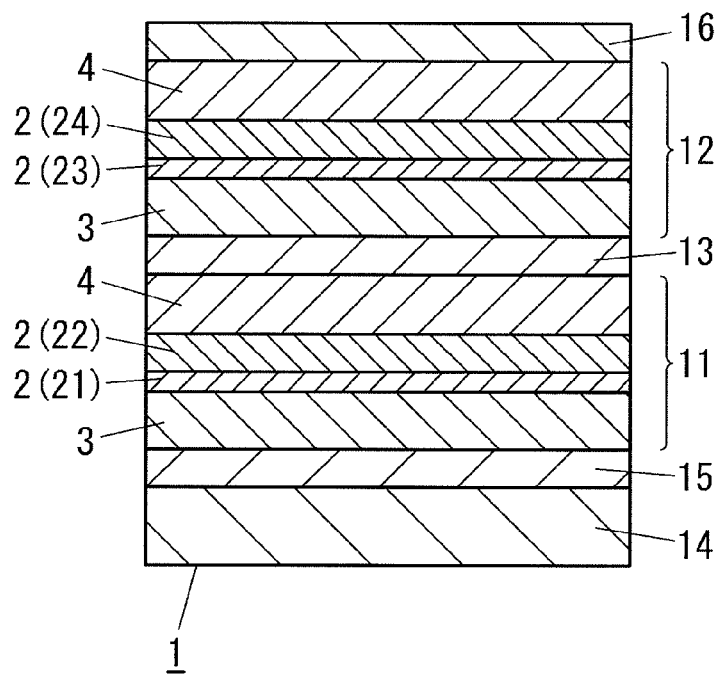
FIG. 1 is a cross-sectional view schematically showing the layer structure of an organic electroluminescent element in an embodiment of the present invention.

FIG. 1 schematically shows one example of the structure of the organic electroluminescent element (organic light emitting diode) in the present embodiment. The organic electroluminescent element 1 is defined as a multi-unit element including a first light emitting unit 11, a second light emitting unit 12, and an interlayer 13 interposed between the first light emitting unit 11 and the second light emitting unit 12.

The organic electroluminescent element 1 has a structure in which a substrate 14, a first electrode 15, the first light emitting unit 11, the interlayer 13, the second light emitting unit 12, and a second electrode 16 are stacked in this order.

It is preferable that the substrate 14 is light transmissive (transparent or translucent). The substrate 14 may be colorless and transparent or slightly colored. The substrate 14 may have a frosted glass appearance.

Examples of material for the substrate 14 include transparent glass such as soda-lime glass and alkali-free glass; and plastic such as polyester resin, polyolefin resin, polyamide resin, epoxy resin, and fluorine-based resin. The shape of the substrate 14 may be a film-like shape or a plate-like shape.

It also is preferable that the substrate 14 has a light diffusion effect. Examples of the structure of this substrate 14 include a structure that includes a matrix phase and particles, a powder, bubbles, or the like that are dispersed in this matrix phase and have a different refractive index from that of the matrix phase; a structure in which shaping processing for improving light diffusion is performed on the surface; and a structure in which a light scattering film or microlens film is placed on the surface of a substrate in order to improve light diffusion.

In the case where it is not necessary for the substrate 14 to transmit light emitted from the organic electroluminescent element 1, the substrate 14 does not need to be light transmissive. In this case, there is no particular limitation on the material for the substrate 14 as long as the element does not lose emission properties, lifetime characteristics, and the like. However, it is preferable that the substrate 14 is formed of a material having high thermal conductivity, such as a metal foil made of aluminum, from the point of view of suppressing a temperature increase in the element.

The first electrode 15 functions as an anode. The anode of the organic electroluminescent element 1 is the electrode for injecting holes into a light emitting layer 2. It is preferable that the first electrode 15 is formed of a material such as a metal, alloy, or electrically conductive compound that has a large work function, or a mixture thereof. Particularly, it is preferable that the first electrode 15 is formed of a material having a work function of 4 eV or greater. In other words, it is preferable that the work function of the first electrode 15 is greater than or equal to 4 eV. Examples of a material for forming this first electrode 15 include metal oxides such as ITO (indium-tin oxide), $SnO_2$, ZnO, and IZO (indium-zinc oxide). The first electrode 15 can be formed with an appropriate method such as vacuum vapor deposition, sputtering, or coating, using these materials. In the case where the first electrode 15 is to transmit light emitted from the organic electroluminescent element 1, it is preferable that the light transmittance of the first electrode 15 is greater than or equal to 70%, and it is more preferable that it is greater than or equal to 90%. Furthermore, it is preferable that the sheet resistance of the first electrode 15 is less than or equal to several hundred $\Omega/\square$, and it is particularly preferable that it is less than or equal to $100\Omega/\square$. The thickness of the first electrode 15 is appropriately selected such that properties such as the light transmittance and sheet resistance of the first electrode 15 are approximately desired values. Although the favorable thickness of the first electrode 15 changes depending on the material constituting the first electrode 15, the thickness of the first electrode 15 may be selected to less than or equal to 500 nm, and preferably selected in the range of 10 nm to 200 nm.

It is preferable that a hole injection layer is placed on the first electrode 15 in order to inject holes from the first electrode 15 into the light emitting layer 2 at a lowered voltage. Examples of the material for forming the hole injection layer include a conductive polymer such as PEDOT/PSS or polyaniline, a conductive polymer that is doped with any acceptor or the like, and a material having conductivity and a light transmissive property such as carbon nanotubes, CuPc (copper phthalocyanine), MTDATA[4,4',4"-Tris(3-methyl-phenylphenylamino)tri-phenylamine], TiOPC (titanyl phthalocyanine), and amorphous carbon. In the case where the hole injection layer is formed of a conductive polymer, for example, the conductive polymer is processed into an ink form, and then it is formed into a film with a method such as a coating or printing to form the hole injection layer. In the case where the hole injection layer is formed of a low molecular organic material or an inorganic substance, for example, the hole injection layer is formed with a vacuum vapor deposition method or the like.

The second electrode 16 functions as a cathode. The cathode of the organic electroluminescent element 1 is the electrode for injecting electrons into the light emitting layer 2. It is preferable that the second electrode 16 is formed of a material such as a metal, alloy, or electrically conductive compound that has a small work function, or a mixture thereof. Particularly, it is preferable that the second electrode 16 is formed of a material having a work function of 5 eV or less. In other words, it is preferable that the work function of the second electrode 16 is less than or equal to 5 eV. Examples of a material for forming such a second electrode 16 include Al, Ag, and MgAg. The second electrode 16 can be formed of an $Al/Al_2O_3$ mixture or the like. In the case where the second electrode 16 is to transmit light emitted from the organic electroluminescent element 1, it is preferable that the second electrode 16 is constituted by multiple layers, and a portion of the multiple layers are formed of a transparent conductive material typified by ITO, IZO, and the like. The second electrode 16 can be formed with an appropriate method such as vacuum vapor deposition or sputtering, using these materials. In the case where the first electrode 15 is to transmit light emitted from the organic electroluminescent element 1, it is preferable that the light transmittance of the second electrode 16 is 10% or less. However, in the case where the second electrode 16 is to transmit light emitted from the organic electroluminescent element 1, it is preferable that the light transmittance of the second electrode 16 is 70% or more. The thickness of the second electrode 16 is appropriately selected such that properties such as the light transmittance and sheet resistance of the second electrode 16 are approximately desired values. Although the favorable thickness of the second electrode 16 changes depending on the material constituting the second electrode 16, the thickness of the second electrode 16 may be selected to less than or equal to 500 nm, and preferably selected in the range of 20 nm to 200 nm.

It is preferable that an electron injection layer is placed on the second electrode 16 in order to inject electrons from the second electrode 16 into the light emitting layer 2 at a lowered voltage. Instances of the material for forming the electron injection layer include an alkali metal, alkali metal halides, alkali metal oxides, alkali metal carbonates, an alkaline earth metal, and an alloy including these metals. Specific instances thereof include sodium, a sodium-potassium alloy, lithium, lithium fluoride, $Li_2O$, $Li_2CO_3$, magnesium, MgO, a magnesium-indium mixture, an aluminum-lithium alloy, and an Al/LiF mixture. The electron injection layer can be formed by an organic layer that is doped with an alkali metal such as lithium, sodium, cesium, or calcium, an alkaline earth metal, or the like.

The first light emitting unit 11 includes the light emitting layer 2. The first light emitting unit 11 may further include a hole transport layer 3, an electron transport layer 4, etc. as necessary. The second light emitting unit 12 also includes a light emitting layer 2. The second light emitting unit 12 may also further include a hole transport layer 3, an electron transport layer 4, etc. as necessary. Each light emitting unit has a layered structure of, for instance, the hole transport layer 3/one or more light emitting layers 2/the electron transport layer 4.

In this embodiment, the first light emitting unit 11 includes, as the light emitting layers 2, a blue region light emitting layer 21 and a green region light emitting layer 22 (a first green region light emitting layer 22) producing fluorescence. The blue region light emitting layer 21 serves as the light emitting layer 2 designed to emit blue light, and the first green region light emitting layer 22 serves as the light emitting layer 2 designed to emit green light. On the other hand, the second light emitting unit 12 includes, as the light emitting layers 2, a red region light emitting layer 23 and a green region light emitting layer 24 (a second green region light emitting layer 24) exhibiting phosphorescence. The red region light emitting layer 23 serves as the light emitting layer 2 designed to emit red light, and the second green region light emitting layer 24 serves as the light emitting layer 2 designed to emit green light.

Each light emitting layer 2 can be formed of an organic material (host material) that is doped with a luminescent organic substance (dopant).

Any material selected from an electron transporting material, a hole transporting material, and an electron transporting and hole transporting material can be used as the host material. The electron transporting material and the hole transporting material may be used together with each other as the host material. The host material may be formed so as to have a concentration gradient inside the light emitting layer 2. For instance, the light emitting layer 2 may be formed such that the concentration of the hole transporting material increases as the distance from the first electrode 15 decreases inside the light emitting layer 2, and the concentration of the electron transporting material increases as the distance from the second electrode 16 decreases. There is no particular limitation on the electron transporting material and the hole transporting material that are used as the host material. For instance, the hole transporting material can be appropriately selected from materials that can constitute the hole transport layer 3 described later. Moreover, the electron transporting material can be appropriately selected from materials that can constitute the electron transport layer 4 described later.

Instances of the host material constituting the first green region light emitting layer 22 include Alq3 (tris(8-oxoquinoline) aluminum (III)), ADN, and BDAF. Instances of the fluorescent dopant in the first green region light emitting layer 22 include C545T (coumarineC545T; 10-2-(benzothiazolyl)-2,3,6,7-tetrahydro-1,1,7,7-tetramethyl-1H,5H,11H-(1)benzopyropyrano(6,7,-8-ij)quinolizine-11-one)), DMQA, coumarin6, and rubrene. It is preferable that the concentration of the dopant in the first green region light emitting layer 22 is in the range of 1 to 20% by mass.

Instances of the host material constituting the second green region light emitting layer 24 include CBP, CzTT, TCTA, mCP, and CDBP. Instances of the phosphorescent dopant in the second green region light emitting layer 24 include $Ir(ppy)_3$ (fac-tris)(2-phenylpyridine)iridium), $Ir(ppy)_2(acac)$, and $Ir(mppy)_3$. It is preferable that the concentration of the dopant in the second green region light emitting layer 24 is in the range of 1 to 40% by mass.

Instances of the host material constituting the red region light emitting layer 23 include CBP (4,4'-N,N'-dicarbazole biphenyl), CzTT, TCTA, mCP, and CDBP. Instances of the dopant in the red region light emitting layer 23 include $Btp_2Ir$ (acac)(bis-(3-(2-(2-pyridyl)benzothienyl)mono-acetylacetonate)iridium (III)), $Bt_2Ir(acac)$, and PtOEP. It is preferable that the concentration of the dopant in the red region light emitting layer 23 is in the range of 1 to 40% by mass.

Instances of the host material constituting the blue region light emitting layer 21 include TBADN (2-t-butyl-9,10-di(2-naphthyl)anthracene), ADN, and BDAF. Instances of the dopant in the blue region light emitting layer 21 include TBP (1-tert-butyl-perylene), BCzVBi, and perylene. Instances of a charge transfer promoting dopant include NPD (4,4'-bis[N-(naphthyl)-N-phenyl-amino]biphenyl), TPD (N,N-bis(3-methylphenyl-(1,1'-biphenyl)-4,4'-diamine), and Spiro-TAD. It is preferable that the concentration of the dopant in the blue region light emitting layer 21 is in the range of 1 to 30% by mass.

Each light emitting layer 2 can be formed with an appropriate method, instances of which include a dry process such as vacuum vapor deposition or transfer, and a wet process such as spin coating, spray coating, dye coating, or gravure printing.

The material constituting the hole transport layer 3 (hole transporting material) is appropriately selected from a group of compounds having a hole transporting property. It is preferable that the hole transporting material is a compound that has a property of donating electrons and is stable when undergoing radical cationization due to electron donation. Instances of the hole transporting material include: triarylamine-based compounds, amine compounds containing a carbazole group, amine compounds containing fluorene derivatives, and starburst amines (m-MTDATA), representative instances of which include polyaniline, 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4'-4"-tris(N-(3-methylphenyl)N-phenylamino)triphenylamine (MTDATA), 4,4'-N,N'-dicarbazole biphenyl (CBP), spiro-NPD, spiro-TPD, spiro-TAD, and TNB; and 1-TMATA, 2-TNATA, p-PMTDATA, TFATA or the like as a TDATA-based material, but instances thereof are not limited to these, and any hole transport material that is generally known is used. The hole transport layer 3 can be formed with an appropriate method such as vapor deposition.

It is preferable that the material for forming the electron transport layer 4 (electron transporting material) is a compound that has the ability to transport electrons, can accept electrons injected from the second electrode 16, and produces excellent electron injection effects on the light emitting layer 2, and moreover, prevents the movement of holes to the electron transport layer 4 and is excellent in terms of thin film formability. Instances of the electron transporting material include Alq3, oxadiazole derivatives, starburst oxadiazole, triazole derivatives, phenylquinoxaline derivatives, and silole derivatives. Specific instances of the electron transporting material include fluorene, bathophenanthroline, bathocuproine, anthraquinodimethane, diphenoquinone, oxazole, oxadiazole, triazole, imidazole, anthraquinodimethane, 4,4'-N,N'-dicarbazole biphenyl (CBP), etc., and compounds thereof, metal-complex compounds, and nitrogen-containing five-membered ring derivatives. Specifically, instances of metal-complex compounds include tris(8-hydroxyquinolinato)aluminum, tri(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)(o-cresolate)gallium, bis(2-methyl-8-quinolinato)(1-naphtholate)aluminum, and bis(2-methyl-8-quinolinato)-4-phenylphenolato, but are not limited thereto. Preferable instances of nitrogen-containing five-membered ring derivatives include oxazole, thiazole, oxadiazole, thiadiazole, and triazole derivatives, and specific instances thereof include 2,5-bis(1-phenyl)-1,3,4-oxazole, 2,5-bis(1-phenyl)-1,3,4-thiazole, 2,5-bis(1-phenyl)-1,3,4-oxadiazole, 2-(4'-tert-butylphenyl)-5-(4"-biphenyl)1,3,4-oxadiazole, 2,5-bis(1-naphthyl)-1,3,4-oxadiazole, 1,4-bis[2-(5-phenylthiadiazolyl)]benzene, 2,5-bis(1-naphthyl)-1,3,4-triazole, and 3-(4-biphenylyl)-4-phenyl-5-(4-t-butylphenyl)-1,2,4-triazole, but are not limited thereto. Instances of the electron transporting material include the polymer material used for the polymer organic electroluminescent element. Instances of this polymer material include polyparaphenylene and derivatives thereof, and fluorene and derivatives thereof. There is no particular limitation on the thickness of the electron transport layer 4, and for instance, it is formed to have a thickness in the range of 10 to 300 nm. The electron transport layer 4 can be formed with an appropriate method such as vapor deposition.

The interlayer 13 serves the function of electrically connecting two light emitting units in series. It is preferable that the interlayer 13 has high transparency and is highly thermally and electrically stable. The interlayer 13 can be formed of a layer that forms an equipotential surface, a charge generation layer, or the like. Instances of the material for a layer that forms an equipotential surface or charge generation layer include: a thin film of metal such as Ag, Au, or Al; metal oxides such as vanadium oxide, molybdenum oxide, rhenium oxide, and tungsten oxide; a transparent conductive film such as ITO, IZO, AZO, GZO, ATO, or $SnO_2$; a so-called laminate of an n-type semiconductor and a p-type semiconductor; a laminate of a metal thin film or transparent conductive film, and either one of or both an n-type semiconductor and a p-type semiconductor; a mixture of an n-type semiconductor and a p-type semiconductor; and a mixture of a metal and either one of or both an n-type semiconductor and a p-type semiconductor. There is no particular limitation on the n-type semiconductor and the p-type semiconductor, and any semiconductors selected as necessary are used. The n-type semiconductor and the p-type semiconductor may be formed of either an inorganic material or an organic material. The n-type semiconductor and the p-type semiconductor may be a mixture of an organic material and a metal; a combination of an organic material and a metal oxide; or a combination of an organic material and an organic acceptor/donor material or inorganic acceptor/donor material. The interlayer 13 can be formed of BCP:Li, ITO, NPD:$MoO_3$, Liq:Al, or the like. BCP represents 2,9-dimethyl-4,7-diphenyl-1,10-phenanthroline. For instance, the interlayer 13 can have a two-layered configuration obtained by disposing a first layer made of BCP:Li on the anode side, and a second layer made of ITO on the cathode side. It is preferable that the interlayer 13 has a layer structure such as TR-E314 (available from TORAY corporation)/$Li_2$O/LG-101 (available from LG Chem, Ltd), TR-E314/$Li_2$O, and TR-E314/$Li_2$O/TR-E314/LG-101.

The organic electroluminescent element 1 according to the present embodiment has such characteristics that, in the element temperature range of 5° C. or greater to 60° C. or less, the element temperature at which the general color rendering index Ra has its maximum is in the range of 15° C. or greater to 35° C. or less. Although room temperature is usually comfortable about 20° C. (referred to as standard room temperature), it fluctuates over a day and also fluctuates with the seasons. Since there are objects having various colors in a room, it is appropriate to discuss color rendering properties in indoor lighting using the general color rendering property. If the element temperature at which the general color rendering index Ra has its maximum is in the range of 15° C. or greater to 35° C. or less as in the present embodiment, in the case where the organic electroluminescent element 1 is applied to indoor lighting uses, there is a decrease in the absolute fluctuation range of color rendering properties from the morning during which the room temperature is low to the daytime during which the temperature increases. Accordingly, objects illuminated by light emitted from the organic electroluminescent element 1 look better. It is particularly preferable that the element temperature at which the general color rendering index Ra has its maximum is 25° C. or close thereto, taking into consideration the fact that the element temperature rises from room temperature due to heat generated at the time of being driven.

It is one object of the present embodiment to realize a high general color rendering index Ra at room temperature. However, the element temperature becomes higher than the environmental temperature due to heat generated as described above. For instance, in the case where the element temperature is higher than the environmental temperature by 5° C. and the temperature corresponding to room temperature is 10° C. to 30° C., the element temperature needs only be 15° C. to 35° C. Also, since the temperature at which people feel comfortable is about 20° C., it is further ideally desirable that the element temperature is 25° C.

Further, the organic electroluminescent element 1 according to the present embodiment has such characteristics that at least one of the maxima of the special color rendering index R10 (yellow), the special color rendering index R11 (green), the special color rendering index R12 (blue) and the special color rendering index R13 (Caucasian complexion) in the range of the element temperature of 5° C. to 60° C. is present in the range of the element temperature of 5° C. to 35° C.

If the organic electroluminescent element 1 has such color rendering properties, foods illuminated by light emitted from the organic electroluminescent element 1 look better at a low temperature. For instance, if the special color rendering index R11, the special color rendering index R12 and the like are high, the appearance of leaf vegetables, green bananas, and the like is improved, if the special color rendering index R10, the special color rendering index R11, and the like are high, the appearance of green and yellow vegetables and the like is improved, and if the special color rendering index R13 and the like are high, the appearance of an object such as a daikon radish having white color as the dominant color is improved. If any one of the special color rendering index R10, the special color rendering index R11, the special color rendering index R12 and the special color rendering index R13 satisfies the above-described conditions, it is possible to make the appearance of foods look better at a low temperature. In the point of view of improving the appearance of multiple types of foods to promote customer purchase motivation and the like, it is preferable that multiple indexes among the special color rendering index R10, the special color rendering index R11, the special color rendering index R12, and the special color rendering index R13 satisfy the above-described conditions, and it is particularly preferable that all of them satisfy the above-described conditions. Furthermore, when foods are stored at a low temperature, objects other than foods such as price tags, product description tags, and the like also are often disposed along therewith, and therefore it is preferable that the general color rendering index Ra is high at a low temperature as well in order to improve the appearance of objects other than foods.

The evaluation of color rendering properties using the color rendering indexes and special color rendering indexes where the organic electroluminescent element 1 is a light source is based on JIS Z8726.

It is preferable that at least one of the maxima of the special color rendering indexes R10 (yellow), R11 (green), R12 (blue), and R13 (Caucasian complexion) of the organic electroluminescent element 1 in the range of the element temperature of 5° C. to 60° C. is present in a range of the element temperature of 15° C. to 35° C. In the case where perishable foods and the like are stored in a food storage device such as a showcase or the like, the opening of the food storage device is usually designed wide so that the perishable foods are easily taken out, and a lighting fixture of the food storage device often illuminates not only foods kept at a low temperature but also a region whose temperature is close to room temperature in the periphery of the opening of the food storage device. In other words, in the case where multiple lighting fixtures are installed in one food storage device, the temperature in the periphery of the fixtures may be a low temperature or may be close to room temperature, depending on the installation locations. In such a case, it is preferable that both the general color rendering index Ra and at least one of the special color rendering index R10, the special color rendering index R11, the special color rendering index R12, and the special color rendering index R13 are high values in a wide range from a low temperature to room temperature. The reason for this is that it is possible to apply an element having one specification to a wide temperature range, and the number of components and the cost are reduced. Furthermore, it is preferable that a change in the appearance of foods due to a temperature change is suppressed. Thus, as described above, it is preferable that the general color rendering index Ra and at least one of the special color rendering index R10, the special color rendering index R11, the special color rendering index R12, and the special color rendering index R13 have an equivalent temperature dependency.

Furthermore, it is preferable that at least one of the general color rendering index Ra, the special color rendering index R10, the special color rendering index R11, the special color rendering index R12 and the special color rendering index R13 of the organic electroluminescent element 1 satisfies the condition that the proportion of the maximum to the minimum in the element temperature range of 5° C. or greater to 25° C. or less is 0.8 or greater, and furthermore the value in the element temperature range is greater than or equal to 70. It is more preferable that multiple indexes among the general color rendering index Ra, the special color rendering index R10, the special color rendering index R11, the special color rendering index R12, and the special color rendering index R13 satisfy the above-described condition, and it is particularly preferable that all of them satisfy the above-described condition. In this case, the appearance of foods illuminated by the organic electroluminescent element 1 is improved and a difference in the appearance is reduced, from a low temperature to room temperature. In other words, the appearance of foods illuminated by the organic electroluminescent element 1 is improved in a wide temperature range, and the organic electroluminescent element 1 is capable of exhibiting good color rendering properties that are approximately the same as or better than those of a fluorescent lamp of color rendering AA.

Furthermore, it is preferable that in the organic electroluminescent element 1 at an element temperature of 5° C., of the special color rendering index R13, the special color rendering index R10 and the special color rendering index R12, the special color rendering index R13 is the largest, followed by the special color rendering index R10 and the special color rendering index R12 in this order, and that in the organic electroluminescent element 1 at an element temperature of 5° C., of the special color rendering index R13, the special color rendering index R11 and the special color rendering index R12, the special color rendering index R13 is the largest, followed by the special color rendering index R11, and the special color rendering index R12 in this order. In this case, the appearance of perishable foods is further improved in the case where perishable foods are illuminated by the organic electroluminescent element 1 in a spotlight manner, or perishable foods are disposed directly under the lighting of the organic electroluminescent element 1. In other words, if the organic electroluminescent element 1 has the color rendering properties described above, the special color rendering index R13 (Caucasian complexion) that affects the appearance of white, which is important for enhancing the sanitary and clean perception of foods at a low temperature, particularly increases. This is followed by an increase in the special color rendering index R11 (green), which affects the appearance of leafy vegetables, which are important in that there are varieties and there is a large market for them. This is followed by an increase in the special color rendering index R10 (yellow), which affects the appearance of green and yellow vegetables, along with the special color rendering index R11 (green). The special color rendering index R12 (blue) that affects the appearance of blue foods, of which there are few varieties, comparatively decreases. Hence, the values of the indexes increase as their priorities increase in the lighting of foods at a low temperature, and the appearance of foods becomes excellent overall at a low temperature. Furthermore, if the value of the general color rendering index Ra is a value between the value of the special color rendering index R13 that is the highest and the value of the special color rendering index R12 that is the lowest, price tags and product descriptions in black-and-white display disposed along with foods significantly look better, and the appearance of foods is also improved.

Furthermore, it is preferable that in the organic electroluminescent element 1 at an element temperature of 5° C., of the special color rendering index R13, the special color rendering index R11, the special color rendering index R10 and the special color rendering index R12, the special color rendering index R13 is the largest, followed by the special color rendering index R11, the special color rendering index R10 and the special color rendering index R12 in this order, and in the organic electroluminescent element 1 at an element temperature of 5° C., of the special color rendering index R13, the general color rendering index Ra, and the special color rendering index R12, the special color rendering index R13 is the largest, followed by the general color rendering index Ra, and the special color rendering index R12 in this order. In this case, the appearance of perishable foods is further improved in the case where perishable foods are illuminated by the organic electroluminescent element 1 in a spotlight manner, or perishable foods are disposed directly under the lighting of the organic electroluminescent element 1. In other words, if the organic electroluminescent element 1 has the color rendering properties described above, the special color rendering index R13 (Caucasian complexion) that affects the appearance of white, which is important for enhancing the sanitary and clean perception of foods at a low temperature, particularly increases. This is followed by an increase in the special color rendering index R11 (green), which affects the appearance of leafy vegetables, which are important in that there are varieties and there is a large market for them. This is followed by an increase in the special color rendering index R10 (yellow), which affects the appearance of green and yellow vegetables, along with the special color rendering index R11 (green). The special color rendering index R12 (blue) that affects the appearance of blue foods, of which there are few varieties, comparatively decreases. As seen from the above, the values of the indexes increase as their priorities increase in the lighting of foods at a low temperature, and the appearance of foods becomes excellent overall at a low temperature. Furthermore, if the value of the general color rendering index Ra is a value between the value of the special color rendering index R13 that is the highest and the value of the special color rendering index R12 that is the lowest, price tags and product descriptions in black-and-white display disposed along with foods significantly look better, and the appearance of foods is also improved.

It is also preferable that with regard to the coordinates u', v' in the u', v' chromaticity diagram (CIE 1976 UCS chromaticity diagram) of the color of light emitted from the organic electroluminescent element 1 in the front direction, the value of u' decreases more and the value of v' increases more in the case where the element temperature is 5° C. than in the case where element temperature is 25° C. The front direction refers to a direction that is identical to the direction in which the plurality of layers constituting the organic electroluminescent element 1 are stacked. In this case, the color of light emitted from the organic electroluminescent element 1 turns more blue as the temperature decreases. Thus, persons who observe foods illuminated by light emitted from the organic electroluminescent element 1 also observe the bluish color of light emitted from the organic electroluminescent element 1, and the color of the emitted light psychologically affects the observers and the observers are given the impression that foods are kept at a low temperature and clean, and the like.

It is also preferable that the value of u' decreases more and the value of v' increases more in the case where the element temperature is 5° C. than in the case where the element temperature is 25° C., and that the color temperature of light emitted from the organic electroluminescent element 1 is higher in the case where the element temperature is 5° C. than in the case where the element temperature is 25° C.

It is also preferable that the color temperature of light emitted from the organic electroluminescent element 1 is higher in the case where the element temperature is 5° C. than in the case where the element temperature is 25° C. In this case, the color of light emitted from the organic electroluminescent element 1 turns more blue as the temperature decreases. Thus, persons who observe foods illuminated by light emitted from the organic electroluminescent element 1 also observe the bluish color of light emitted from the organic electroluminescent element 1, and the color of the emitted light psychologically affects the observers and the observers are given the impression that foods are kept at a low temperature and clean, and the like.

It is also preferable that the value of u' decreases more and the value of v' increases more in the case where the element temperature is 5° C. than in the case where the element temperature is 25° C., and that the color temperature of light emitted from the organic electroluminescent element 1 is higher in the case where the element temperature is 5° C. than in the case where the element temperature is 25° C.

It is also preferable that with regard to values of u' and v' in the u', v' chromaticity diagram of a color of light in the front direction, the value of u' increases more and the value of v' increases more in the case where the element temperature is 5° C. than in the case where the element temperature is 25° C. In this case, the color of light emitted from the organic electroluminescent element 1 at a low temperature turns more green and blue. Thus, persons who observe foods illuminated by light emitted from the organic electroluminescent element 1 also observe the greenish and bluish color of light emitted from the organic electroluminescent element 1, and the color of the emitted light psychologically affects the observers and the observers are given the impression that foods are kept at a low temperature and clean, and the like.

It is also preferable that the color temperature of light is lower in the case where the element temperature is 5° C. than in the case where the element temperature is 25° C. In this case, when reddish food is illuminated by light emitted from the organic electroluminescent element 1 at a low temperature, the appearance of the food is improved.

It is also preferable that with regard to values of u' and v' in the u', v' chromaticity diagram of a color of light in the front direction, the value of u' increases more and the value of v' increases more in the case where the element temperature is 5° C. than in the case where the element temperature is 25° C., and that the color temperature of light is lower in the case where the element temperature is 5° C. than in the case where the element temperature is 25° C.

It is also preferable that with regard to values of u' and v' in the u', v' chromaticity diagram of a color of light in the front direction, the value of u' increases more and the value of v' increases more in a case where the element temperature is 5° C. than in a case where the element temperature is 25° C., and that the color temperature of light is lower in the case where the element temperature is 5° C. than in the case where the element temperature is 25° C.

The organic electroluminescent element 1 according to the present embodiment is suitable for normal indoor lighting at room temperature, and for the lighting of foods at a low temperature. Different intended uses and use conditions from room temperature to a low temperature can be realized using one type of an organic electroluminescent element 1. Thus, the need to develop and manufacture different organic electroluminescent elements 1 for different uses and conditions is eliminated, and therefore the cost can be reduced.

The organic electroluminescent element 1 according to the present embodiment is realized as follows.

In the first light emitting unit 11, a blue region light emitting layer 21 and a first green region light emitting layer 22 are disposed close to a first electrode 15 and a second electrode 16, respectively. In the second light emitting unit 12, a red region light emitting layer 23 and a second green region light emitting layer 24 are disposed close to the first electrode 15 and the second electrode 16, respectively.

As described above, the first green region light emitting layer 22 contains fluorescent dopants, and the second green region light emitting layer 24 contains phosphorescent dopants. The phosphorescent dopants emit light even when they are in a triplet state, and therefore the phosphorescent dopants have a luminous efficiency that is approximately four times higher than that of fluorescent dopants emitting light only when they are in a singlet state, and highly efficient light emission, ideally an internal quantum efficiency of 100%, is possible.

Figure 2:
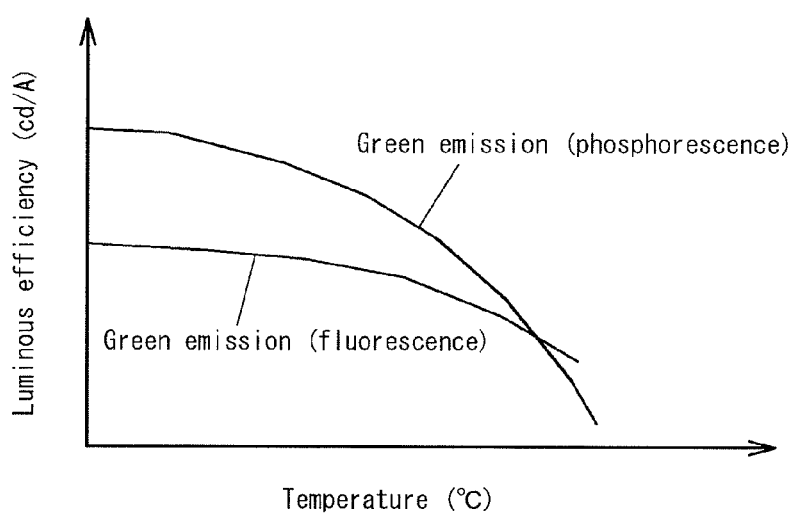
FIG. 2 is a graph showing one instance of the temperature dependency of the luminous efficiency of a green phosphorescent dopant and a green fluorescent dopant.

Furthermore, with regard to the green dopants, the luminous efficiency of the phosphorescent dopant has a higher temperature dependency than that of the fluorescent dopant. The value of the luminous efficiency of the phosphorescent dopant significantly decreases as compared with the fluorescent dopant at a high temperature, as shown in FIG. 2. This is because of high thermal inactivation of the phosphorescent dopant.

It is possible to design each color rendering property at room temperature and a low temperature utilizing the properties of such a green phosphorescent dopant. In other words, with the present embodiment, the organic electroluminescent element 1 includes both the green region light emitting layer 22 containing fluorescent dopants and the green region light emitting layer 24 containing phosphorescent dopants, and it is possible to realize an optimal color rendering property at room temperature and a low temperature respectively, utilizing differences in the temperature dependency of these green region light emitting layers 22 and 24.

For instance, in the graph shown in FIG. 2, if a temperature region in which there are slight changes in the luminous efficiencies of the fluorescent dopant and the phosphorescent dopant caused by temperature is close to room temperature, the intensity of a component in the green region of the entire emission spectrum is increased. The emission intensities of the red region light emitting layer 23 and the blue region light emitting layer 21 are designed so as to fit the intensity of green, and thus the general color rendering property can be designed so as to significantly increase at room temperature. Next, in a low temperature region, if the luminous efficiency of the phosphorescent dopant is improved to the same extent as or greater than when at room temperature, the intensity of the component in the green region of the entire emission spectrum is maintained at the same extent as that at room temperature or is relatively improved. Accordingly, the emission spectrum is maintained at the same extent as that at room temperature, or the color of emitted light turns more blue.

Figure 9:
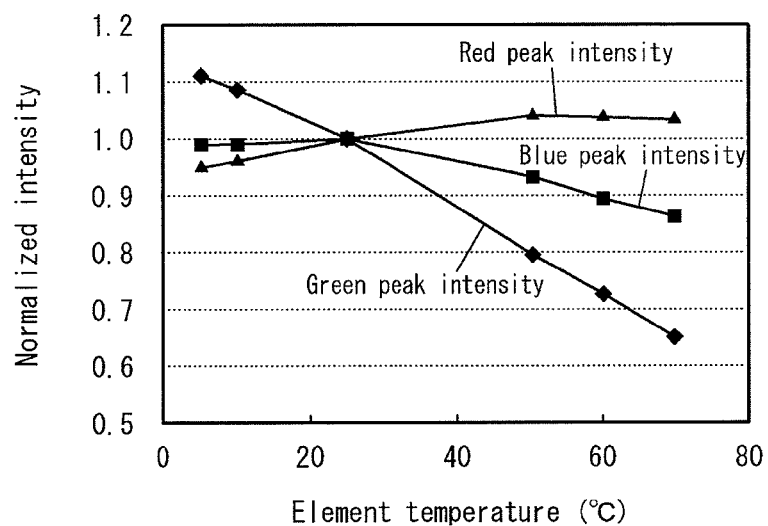
FIG. 9 is a graph showing the temperature dependency of intensities of peaks of blue, green, and red in the emission spectrum of light emitted from the organic electroluminescent element in the first example.
Figure 10:
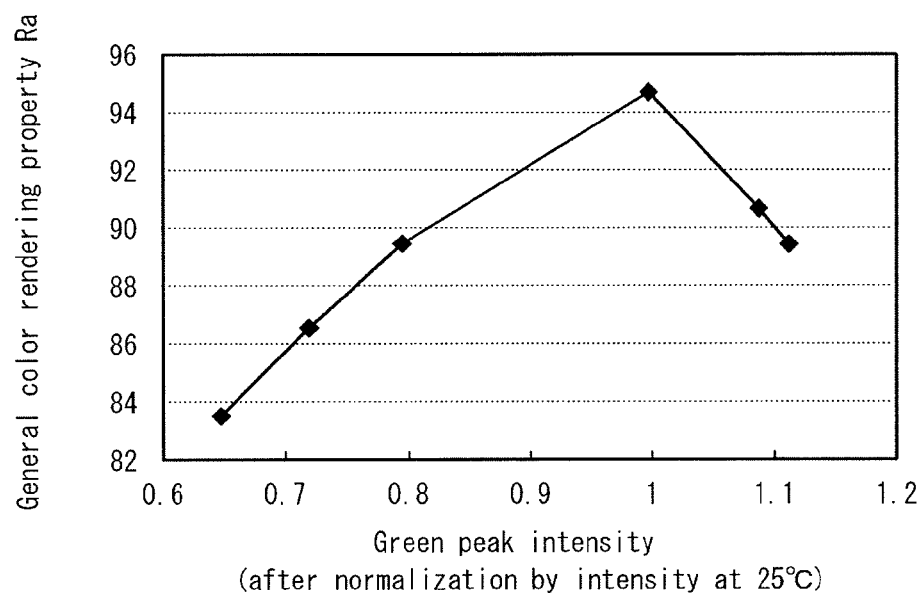
FIG. 10 is a graph showing a relationship between the green peak intensity and a general color rendering index Ra in the emission spectrum of light emitted from the organic electroluminescent element in the first example.

Accordingly, the maximums of the special color rendering index R10, the special color rendering index R11, the special color rendering index R12, and the special color rendering index R13 can be adjusted to be in the element temperature range of 5° C. or greater to 35° C. or less, or further adjusted to be in the element temperature range of 15° C. or greater to 35° C. or less. Also, in the element temperature range of 5° C. or greater to 25° C. or less, the general color rendering index Ra, the special color rendering index R10, the special color rendering index R11, the special color rendering index R12, and the special color rendering index R13 can be adjusted such that they increase overall and the changes thereof with temperature decrease. Furthermore, the special color rendering indexes R13, R11, R10, and R12 can be adjusted such that at an element temperature of 5° C., the special color rendering index R13 is the largest, followed by the special color rendering index R11, the special color rendering index R10, and the special color rendering index R12 in this order. The special color rendering index R13, the general color rendering index Ra, and the special color rendering index R12 are adjusted such that at an element temperature of 5° C., the special color rendering index R13 is the largest, followed by the general color rendering index Ra, and the special color rendering index R12 in this order. The value of the color rendering property is calculated based on the shape of the emission spectrum, and therefore the changes with temperature for various types of color rendering properties depend on changes with temperature in the shape of the emission spectrum. The inventors of the present application found that when an element is configured such that as shown in FIG. 10, particularly along with a decrease in the element temperature, the intensity of the spectrum in the green region increases, and the intensity in the blue region levels off, and the intensity in the red region slightly decreases, the changes with temperature in various types of color rendering properties described above can be realized. For instance, if the element temperature changes to a low temperature of 5° C. from 25° C. at which the general color rendering index Ra is high, the intensity in the green region increases, and the intensity in the blue region levels off, and the intensity in the red decreases (FIG. 9). Therefore, the intensity in the red region relatively decreases, and this causes an increase in the color rendering property (for instance, the special color rendering index R13) emphasizing white. Also, with the present embodiment, in order to make objects having various colors look good, the absolute value of the special color rendering index (R12) of blue having a low frequency of appearance of color is suppressed among the three primary colors of red, green and blue, and instead, the general color rendering index Ra and the special color rendering index R13 are improved. Therefore, the relationship of R13>Ra>R12 holds true at 5° C.

Also, when the element temperature decreases, the u' value of the color of emitted light decreases and the v' value thereof increases. Hence, the color temperature of the emitted light is increased. Therefore, it is possible to achieve the configuration in which the value of u' decreases more and the value of v' increases more in the case where the element temperature is 5° C. than in the case where the element temperature is 25° C. and the color temperature of light emitted from the organic electroluminescent element 1 is higher in the case where the element temperature is 5° C. than in the case where the element temperature is 25° C.

Similarly, it is possible to achieve the configuration in which with regard to values of u' and v' in the u', v' chromaticity diagram of a color of light in the front direction, the value of u' increases more and the value of v' increases more in the case where the element temperature is 5° C. than in the case where the element temperature is 25° C. and the color temperature of light is lower in the case where the element temperature is 5° C. than in the case where the element temperature is 25° C.

With regard to the organic electroluminescent element 1 including the light emitting layer 2 designed to emit light in the red region, the light emitting layer 2 designed to emit light in the green region, and the light emitting layer 2 designed to emit light in the blue region, it is efficient to control the emission intensity of the light emitting layer 2 designed to emit light in the green region in order to design the emission spectrum for providing color rendering properties in accordance with the element temperature. This is because the green region is a medium wavelength region in the visible spectrum, and the base of a curve of the emission spectrum of the light emitting layer 2 designed to emit light in the green region overlaps with the red region on a long wavelength side and the blue region on a short wavelength side. Accordingly, if the emission intensity in the green region changes due to a change in the intensity of light emitted from the light emitting layer 2 designed to emit light in the green region, the emission intensities in the red region on a long wavelength side and the blue region on a short wavelength side also are accordingly affected. Thus, the values of various color rendering properties such as skin color that primarily contains red and green components and secondarily contains a blue component, blue-green intermediate between green and blue, and the like can be efficiently controlled with the intensity of the light emitted from the light emitting layer 2 designed to emit light in the green region. In other words, even if the types of dopants of red, green and blue and the film thickness of the light emitting layer 2 are not adjusted to individually optimize light emitted from the light emitting layer 2 of each color, the intensity of light emitted from the light emitting layer 2 designed to emit light in the green region is mainly adjusted, and blue and red are adjusted following green, as a result of which it is possible to realize various color rendering properties of the organic electroluminescent element 1 and the temperature dependencies of color rendering properties.

First, in order to achieve the configuration in which the general color rendering index Ra has its maximum at the element temperature of 15° C. to 35° C., the element is configured such that a color temperature calculated from the waveform of the emission spectrum at a temperature (for instance, 25° C.) that falls within the element temperature range of 15° C. to 35° C. lies on the color temperature curve, and the relative intensity of the emission spectrum in the green region increases on a low temperature side, and decreases on a high temperature side. Accordingly, the point of the color of emitted light on the u' v' chromaticity diagram (CIE 1976 UCS chromaticity diagram) intersects the color temperature curve in a transition from a low temperature to a high temperature. If this spectrum change is calculated with regard to the general color rendering index Ra, the general color rendering index Ra has a peak around room temperature.

As the element temperature decreases, the movement distance of an exciton is hardly affected by scattering and extends, and energy transfer from the green region light emitting layer 24 to the red region light emitting layer 23 increases. Therefore, in the case where the general color rendering index Ra has its maximum when the element temperature is low, it is preferable that the film thickness rate of the red region light emitting layer 23 to the second green region light emitting layer 24 is smaller. On the other hand, it is preferable that the film thickness rate of the red region light emitting layer 23 to the second green region light emitting layer 24 increases more with an increase in the element temperature at which the general color rendering index Ra has its maximum.

Figure 3:
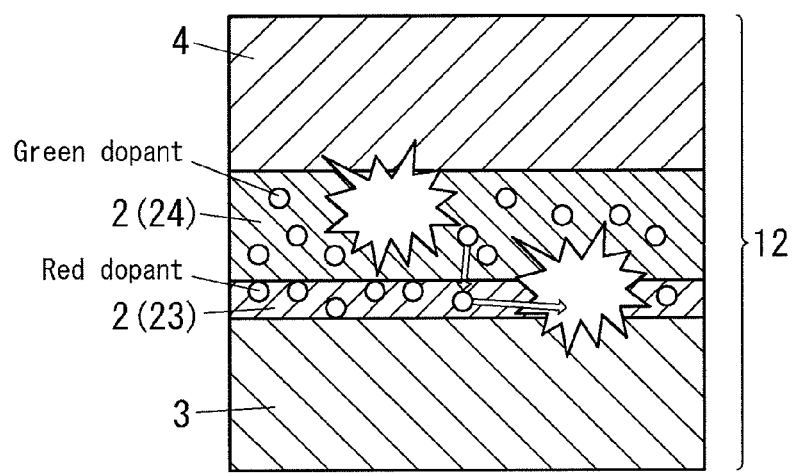
FIG. 3 is an estimated mechanism diagram showing a mechanism estimated to be the cause of the occurrence of a drop in emission intensity in a green region at a high temperature.

The temperature dependency of the emission intensity in the green region can be controlled by adjusting the thickness rate of the red region light emitting layer 23 to the second green region light emitting layer 24 of the second light emitting unit 12, the concentration of dopant, and the like. The phosphorescent dopants in the second green region light emitting layer 24 thermally inactivate more at a high temperature even in the case of a single dopant, and the emission intensity in the green region decreases. However, if the second green region light emitting layer 24 is in contact with the red region light emitting layer 23, the emission intensity in the green region further decreases at a high temperature. In other words, the emission intensity in the green region relatively increases at a low temperature. FIG. 3 shows a mechanism estimated to cause the occurrence of a drop in emission intensity. It is conceivable that in the second green region light emitting layer 24 adjacent to the red region light emitting layer 23, not all of the exciton energy causes green emission, and some exciton energy is transferred to the dopant or the host material inside the red region light emitting layer 23, and finally causes light emission in the red region in the red region light emitting layer 23. An exciton at the time of emitting phosphorescence usually has a longer exciton lifetime than that of fluorescent material because of transition from a triplet, and therefore energy transfer from the second green region light emitting layer 24 containing phosphorescent dopants to the red region light emitting layer 23 noticeably appears. The amount of energy transfer from the second green region light emitting layer 24 to the red region light emitting layer 23 can be controlled by adjusting the exciton lifetime, the movement distance of an exciton, the concentration of dopant, and the like.

For instance, as the thickness of the second green region light emitting layer 24 increases, the movement distance of an exciton from the second green region light emitting layer 24 to the red region light emitting layer 23 increases, and therefore the amount of transferred energy decreases. Also, as the thickness of the red region light emitting layer 23 decreases and/or the concentration of dopant in the red region light emitting layer 23 decreases, energy is unlikely to be transferred from the green region light emitting layer 22 to the red region light emitting layer 23. Also, in addition to the above, emission in the green region thermally inactivates greatly at a high temperature, and in contrast, the intensity of the spectrum in the green region relatively increases at a low temperature. Therefore, the effect that the relative intensity of the spectrum in the green region increases relative to the red region is obtained. Thus, by adjusting the thickness of the second green region light emitting layer 24, the thickness of the red region light emitting layer 23, the concentration of dopant in the red region light emitting layer 23, and the like, it is possible to design the element such that energy transfer from the second green region light emitting layer 24 to the red region light emitting layer 23 is sufficiently reduced at a low temperature so that the emission intensity in the green region sufficiently increases, and that a sufficient amount of energy is transferred from the second green region light emitting layer 24 to the red region light emitting layer 23 at a high temperature so that the emission intensity in the green region decreases, or emission in the green region decreases due to thermal inactivation at a high temperature.

For instance, if the thickness of the second green region light emitting layer 24 increases, the influence of thermal inactivation in the second green region light emitting layer 24 increases at a high temperature and the intensity in the green region decreases, and the rates of intensities in the red region and the blue region relatively decrease at a low temperature. In contrast, if the thickness of the second green region light emitting layer 24 decreases, the influence of thermal inactivation in the second green region light emitting layer 24 relatively decreases, and the rate of energy transfer from the second green region light emitting layer 24 to the red region light emitting layer 23 increases, as a result of which the intensity in the red region increases. If the thickness of the second green region light emitting layer 24 is excessively reduced, energy transfer to the red region light emitting layer 23 is too large even at room temperature to obtain a high general color rendering property at room temperature. On the other hand, if the thickness of the red region light emitting layer 23 increases, the intensity in the red region increases, and if the thickness thereof decreases, the intensity in the red region decreases. Taking these facts into consideration, the optimal thicknesses of the second green region light emitting layer 24 and the red region light emitting layer 23 and the thickness rate can be determined. Particularly, it is preferable that the thickness of the red region light emitting layer 23 is adjusted in the range of 2% or greater to 15% or less of the thickness of the second green region light emitting layer 24. Since the movement distance of an exciton of phosphorescence is usually greater than or equal to 20 nm and less than or equal to 60 nm, it is preferable that the thickness of the second green region light emitting layer 24 is the same extent as this, that is, greater than or equal to 20 nm and less than or equal to 60 nm, taking into consideration energy transfer from the second green region light emitting layer 24 to the red region light emitting layer 23.

From the point of view of optical design, if the total thickness of the red region light emitting layer 23 and the second green region light emitting layer 24 is a constant value, the proportion of the emission intensity of the red region light emitting layer 23 to the emission intensity of the second green region light emitting layer 24 can be controlled in a state in which the total thickness of the entire organic electroluminescent element 1 is kept at an optically optimal thickness. Hence, the degree of freedom in designing can be improved. In other words, it is possible to design an element having a low driving voltage and high efficiency. Therefore, it is desirable to select each film thickness in the range of the above-described film thickness.

Also, if the concentration of dopant in the red region light emitting layer 23 is excessively increased, the luminous efficiency decreases due to concentration quenching, but a high concentration of dopant is more advantageous to receiving energy transfer from the second green region light emitting layer 24. The optimal value of this concentration is determined taking this balance into consideration. Particularly, it is preferable that the concentration of dopant in the red region light emitting layer 23 is adjusted in the range of 0.2% by mass or greater to 10% by mass or less. Concentration quenching noticeably occurs particularly in the case where phosphorescent dopant is used. This is because energy movement/thermal inactivation of an exciton is likely to occur between dopants because phosphorescence has a long exciton lifetime.

In a specific process of designing an element, for instance, the emission spectrum of white light of the element is separated with simulation based on the photoluminescence (PL) spectra of individual dopants used in the red region, blue region and green region light emitting layers 2. At this time, in order to calculate the contribution of a spectrum of each color to the color rendering property at a given temperature, first, the emission spectrum of white light of the element is separated into spectra in the red region, the blue region and the green region. Next, the area % of a spectrum of each color occupying the white spectrum can be firstly calculated at a given temperature by determining the size (for instance, the inner area of the spectrum) of the spectrum of each color. Next, a change with temperature in the area % of a spectrum of each color can be determined by separating white spectra at various temperatures into spectra of RGB with the above-described method. Finally, the relationship between the color rendering property calculated from the white spectrum itself and the area % of each color described above can be determined from the contribution of each factor (that is, the magnitude of a change with temperature in the area % of each color) by using and approximating data on a change with temperature of an individual factor with multiple regression. Specifically, assuming that a change with temperature in a color rendering property is Y, and changes with temperature in spectra of respective colors are Rx, Gx, and Bx, respectively, the contributions of Rx, Gx and Bx to Y need only be calculated when Y is approximated as follows:

$$Y = \alpha \times Rx + \beta \times Gx + \gamma \times Bx + \text{(constant term)} \text{ (where } \alpha, \beta \text{ and } \gamma \text{ are coefficients)}.$$

Color rendering properties can be controlled by adopting another method, instead of designing the red region light emitting layer 23 and the second green region light emitting layer 24 as described above, or in addition to this.

For instance, the color rendering properties can be controlled by selecting organic materials constituting the first light emitting unit 11, the second light emitting unit 12, the interlayer 13, and the like. The electron mobility (hole mobility or electron mobility) of these organic materials has temperature dependency. By using the temperature dependency of such electron mobility, it is possible to control the temperature dependency of an emission spectrum.

For instance, the location at which carrier balance in the organic electroluminescent element 1 at a high temperature has its maximum is adjusted by selecting organic material so as to be positioned near the first light emitting unit 11. Accordingly, the emission intensity of the second green region light emitting layer 24 at a high temperature is suppressed. Consequently, the emission intensity of the second green region light emitting layer 24 is relatively improved at a high temperature. Generally, charge mobility of organic material increases more as the temperature increases, and for instance, if a change with temperature in the hole mobility of the hole transport material used in the first light emitting unit 11 is relatively small and a change with temperature in the electron mobility in the electron transport material used in the second light emitting unit 12 is relatively large, light emitted from the first light emitting unit 11 is more intense at a high temperature, and thus the emission intensity of the second green region light emitting layer 24 is suppressed.

The structure of the organic electroluminescent element 1 is not limited to the above-described instance. For instance, the number of light emitting units may be one or three or greater. If the number of light emitting units increases, a high luminous efficiency is increased in accordance with the number of units even when the current amount is constant. Also, it is possible to suppress short-circuits between electrodes caused by foreign objects or minute unevenness of the substrate 14, defects caused by leakage current, and the like because of an increase in the total film thickness of the organic electroluminescent element 1. Hence, the yield is improved. Furthermore, the overall number of light emitting layers 2 in the entire organic electroluminescent element 1 is increased by providing each of the plurality of light emitting units with one or multiple light emitting layers 2. Variation on the plane of the element, and variations in brightness, chromaticity and color rendering properties at a viewing angle are mainly caused by shift in optical interference in the organic electroluminescent element 1. Therefore, if the total number of light emitting layers 2 in the organic electroluminescent element 1 increases, the optical interference is more averaged and variations in these performance variations are reduced. Since interference conditions change with not only the number of light emitting layers 2 but also the positions of the light emitting layers 2 in the element, it is preferable that the both are designed in correspondence with each other. Furthermore, if the number of light emitting layers 2 having the same light emitting color is large, a change in lifetime characteristics at conduction also is averaged, and therefore an effect of suppressing lifetime variation can also be obtained.

Furthermore, if the organic electroluminescent element includes multiple light emitting units, each light emitting unit can include all of the red region, green region and blue region light emitting layers 2, or selectively include them. Therefore, the degree of freedom in designing the spectrum, that is, the degree of freedom in designing the color rendering properties increases if the types and the total number of light emitting layer 2 increase, leading to an appropriate design of color rendering properties according to the present embodiment.

There is no particular limitation on the number of light emitting layers 2 in one light emitting unit, and the number thereof may be one, two or greater. Also, in the structure of the organic electroluminescent element 1 described above, the structure of the light emitting layer 2 of the first light emitting unit 11 and the structure of the light emitting layer 2 in the second light emitting unit 12 may be switched.

Both the dopant of the first green region light emitting layer 22 and the dopant of the second green region light emitting layer 24 may be a phosphorescent dopant. In this case, if the change with temperature in the emission intensity in the green region further increases, the change with temperature in color rendering properties further increases. Such organic electroluminescent elements 1 can be applied to uses in which the change with temperature in color rendering properties is further actively utilized, for instance. If a fluorescent dopant having a large temperature dependency of emission intensity is used, the dopant of the light emitting layer 2 designed to emit light in the green region may be only a fluorescent dopant (for instance, both the dopant of the first green region light emitting layer 22 and the dopant of the second green region light emitting layer 24 are a fluorescent dopant). In other words, the organic electroluminescent element 1 may include at least one light emitting layer 2 designed to emit light in the green region and have a high temperature dependency of emission intensity, in which emission intensity decreases at a high temperature and emission intensity relatively increases at a low temperature.

Also, although the shape of an emission spectrum is most easily adjusted by the emission intensity of the light emitting layer 2 designed to emit light in the green region as described above, for instance, even in the case where the organic electroluminescent element 1 includes the phosphorescent red region light emitting layer 2 and the fluorescent red region light emitting layer 2, an effect of adjusting the change with temperature in color rendering properties can be obtained.

It is preferable that the organic electroluminescent element 1 includes one or more of each of the light emitting layer 2 designed to emit green light, the light emitting layer 2 designed to emit red light, and the light emitting layer 2 designed to emit blue light. However, if the organic electroluminescent element 1 according to the present invention can be realized by utilizing the temperature dependencies of emission properties of the phosphorescent light emitting layer 2, combinations of various light emitting layers 2 may be adopted, such as a combination of the light emitting layer 2 designed to emit blue light and the light emitting layer 2 designed to emit yellow light, a combination of the light emitting layer 2 designed to emit blue light, the light emitting layer 2 designed to emit orange light, and the light emitting layer 2 designed to emit red light, and the like.

Figure 4:
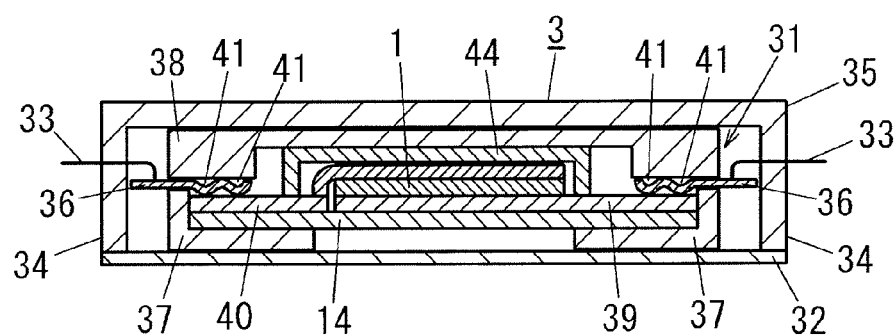
FIG. 4 is a cross-sectional view showing a lighting fixture in an embodiment of the present invention.
Figure 5:
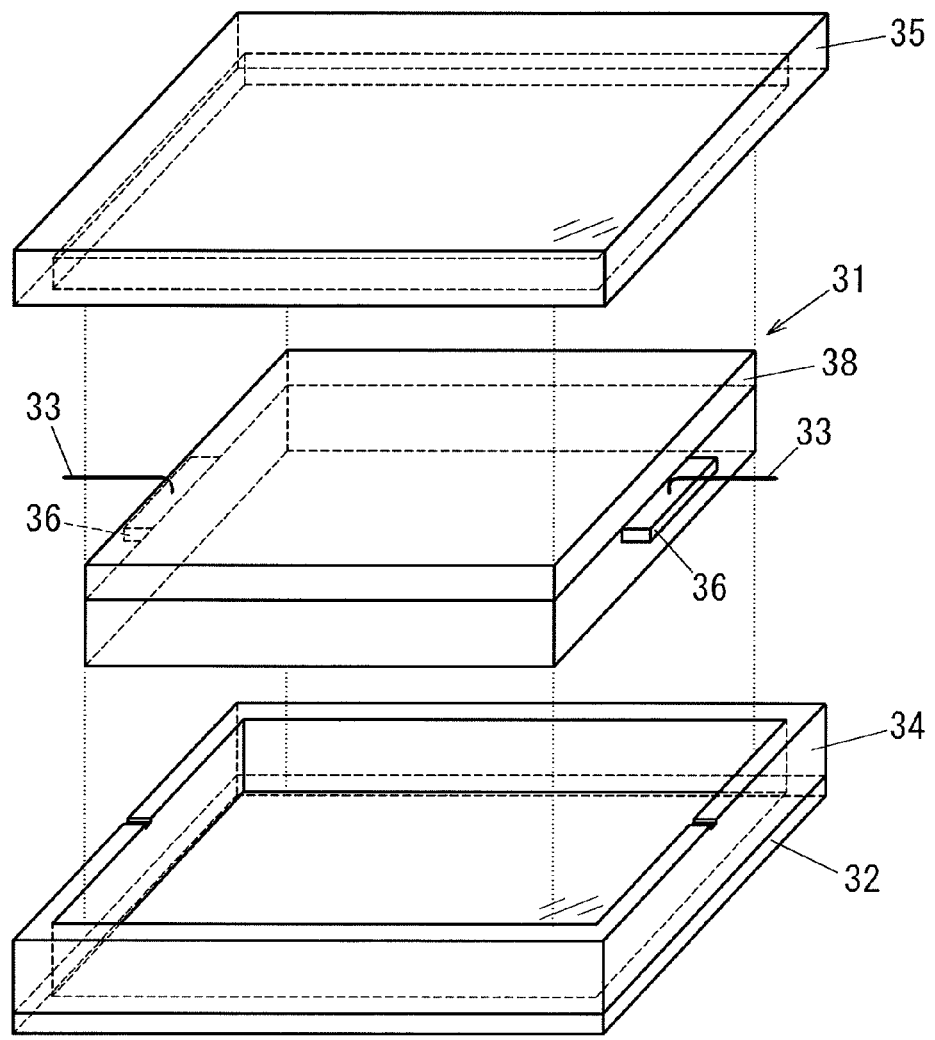
FIG. 5 is an exploded perspective view of the lighting fixture.
Figure 6:
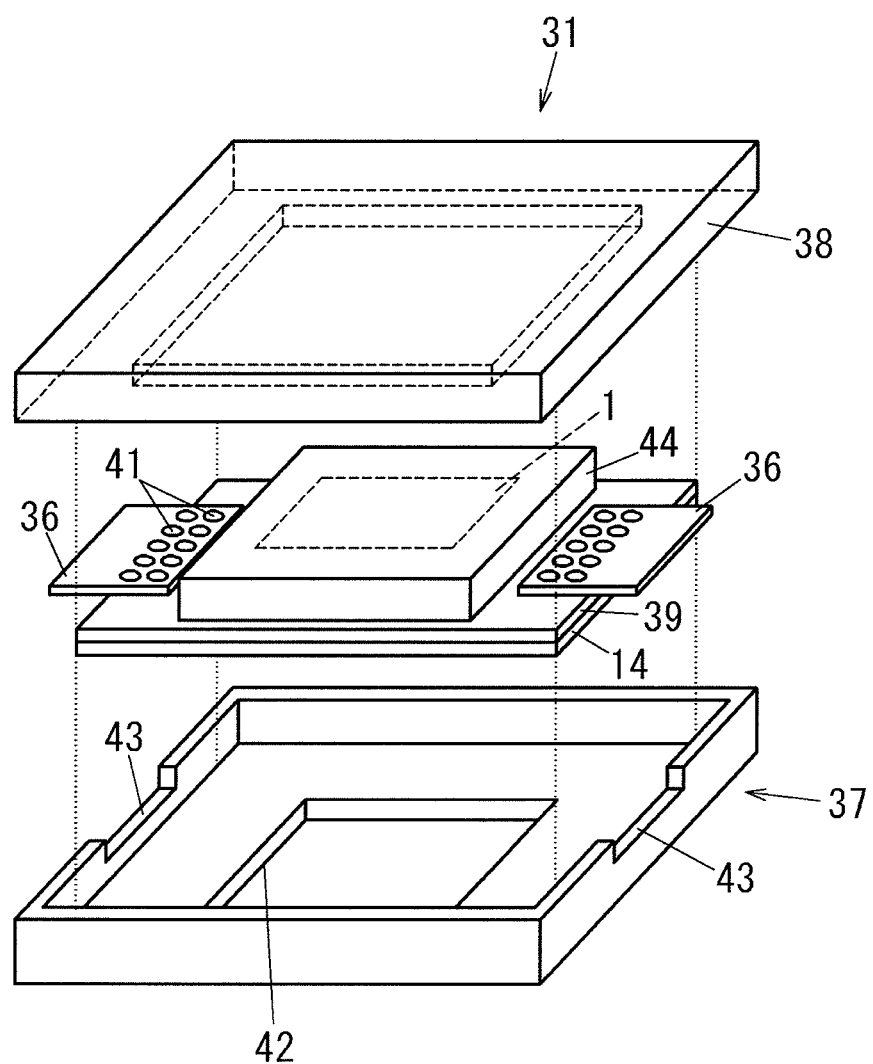
FIG. 6 is an exploded perspective view showing a unit in the lighting fixture.

The lighting fixture 3 includes the organic electroluminescent element 1, a connection terminal connecting the organic electroluminescent element 1 and a power source, and a housing holding the organic electroluminescent element 1. FIGS. 4 to 6 show one instance of the lighting fixture 3 including the organic electroluminescent element. The lighting fixture 3 includes: a unit 31 that includes the organic electroluminescent element 1; a housing that holds the unit 31; a front panel 32 that transmits light emitted from the unit 31; and wiring units 33 for supplying power to the unit 31.

The housing includes a front-side housing 34 and a back-side housing 35. The front-side housing 34 is formed into a frame shape, and the back-side housing 35 is formed into a lid shape having an open bottom. The front-side housing 34 and the back-side housing 35 are laid on top of each other so as to hold the unit 31 therebetween. The front-side housing 34 has grooves for allowing the wiring units 33 that are conductive leads, connectors, etc. to pass through, at a peripheral portion that comes into contact with the side wall of the back-side housing 35, and moreover, the plate-shaped front panel 32 having transparency is disposed at the open bottom.

The unit 31 includes the organic electroluminescent element 1, power supply parts 36 for supplying power to the organic electroluminescent element 1, a front-side case 37 and a back-side element case 38. The front-side case 37 and the back-side element case 38 hold the organic electroluminescent element 1 and the power supply units 36 therebetween.

A positive electrode 39 connected to the first electrode 15 and a negative electrode 40 connected to the second electrode 16 are formed on the substrate 14 of the organic electroluminescent element 1. A sealing substrate 44 is also provided on the substrate 14 to cover the organic electroluminescent element 1. The pair of power supply units 36 connected to the wiring units 33 come into contact with the positive electrode 39 and the negative electrode 40 respectively to supply power to the organic electroluminescent element 1.

One of the power supply parts 36 has a plurality of contacts 41 that make contact with the positive electrode 39 and the other includes a plurality of contacts 41 that make contact with the negative electrode 40. These contacts 41 are pressed against corresponding one of the positive electrode 39 and the negative electrode 40 by the element cases 37 and 38. Consequently, the power supply parts 36 are mechanically and electrically connected to the positive electrode 39 and the negative electrode 40 at many points, respectively. Each contact 41 is formed into a dimpled shape by performing a bending process on the power supply part 36 made of a metal conductor such as a copper plate or a stainless steel plate, and protrusions defined by the dimpled portions come into contact with corresponding one of the positive electrode 39 and the negative electrode 40. Note that for instance, the power supply part 36 may be a power supply unit obtained by providing a line-shaped metal conductor with coil-shaped contacts 41, instead of the power supply part obtained by providing a plate-shaped metal conductor with the dimpled contacts 41.

The element cases 37 and 38 are each formed into a lid shape. The front-side element case 37 is provided at a case wall facing the substrate 14 of the organic electroluminescent element 1 with an opening portion 42 for allowing light to pass, and is provided at a case side wall with groove portions 43 for receiving the power supply parts 36. The element cases 37 and 38 are formed of resin such as acryl or the like, and are laid on top of each other so that side walls thereof come into contact with each other to form a rectangular parallelepiped box shape, and hold the organic electroluminescent element 1 and the power supply parts 36 therebetween.

A food storage device includes a storage configured to store food, and the lighting fixture 3. The lighting fixture 3 includes the organic electroluminescent element 1 configured to illuminate food in the storage. Specific instances of the storage include a showcase and a dish display shelf for a buffet. It is preferable that the food storage device for a low temperature includes a cooler for cooling food stored in the storage and keeping it cool. It is preferable that the storing temperature is about 5° C. to mainly prevent food poisoning.

Figure 7:
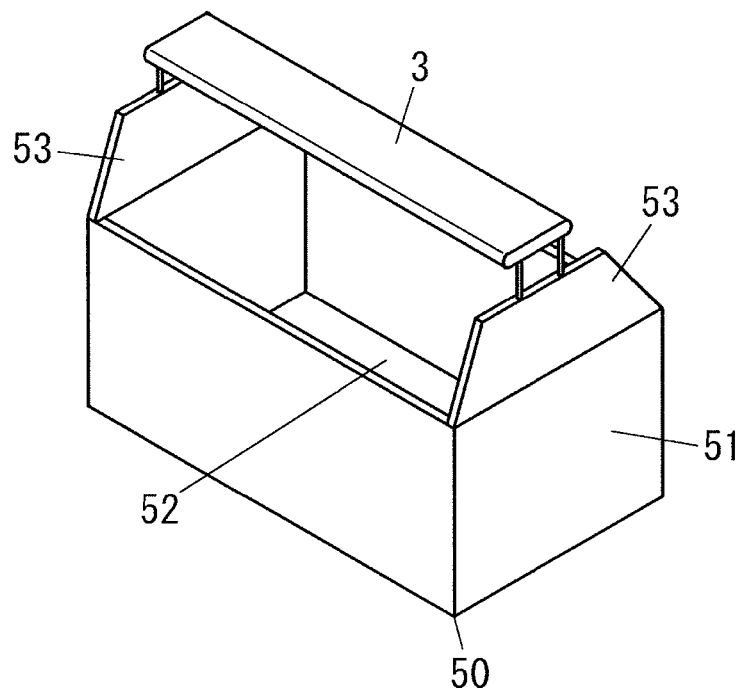
FIG. 7 is a perspective view showing one instance of a food storage device in an embodiment of the present invention.

FIG. 7 shows one instance of such a food storage device 50. The food storage device 50 is an open showcase, and a storage 51 of the food storage device 50 has a recess 52 that is upwardly open. Food can be stored in the recess 52. Support plates 53 and 53 are attached to both side portions of the storage 51 so as to protrude above the recess 52. The lighting fixture 3 is disposed above the recess 52, and the two ends of the lighting fixture 3 are respectively fixed to the two support plates 53 and 53. The lighting fixture 3 illuminates the interior of the recess 52. A cooler, a fan or the like for cooling the interior of the recess 52 is installed in the storage 51.

This food storage device 50 can be used for storing ingredients or cooked dishes and displaying them to a customer, for the purpose of selling them. According to this food storage device 50, the appearance of foods can be significantly improved by illuminating foods stored in the storage 51 at a low temperature with light emitted from the lighting fixture 3 including the organic electroluminescent element 1.

EXAMPLES

The first electrode 15 was formed by forming ITO into a film having a thickness of 130 nm on the glass substrate 14. Furthermore, a hole injection layer made of PEDOT/PSS and having a thickness of 35 nm was formed on the first electrode 15 with a wet method. Subsequently, the hole transport layer 3, the blue region light emitting layer 21 (fluorescence), the first green region light emitting layer 22 (fluorescence), and the electron transport layer 4 were successively formed so as to each have a thickness of 5 nm to 60 nm, with a vapor deposition method. Next, the interlayer 13 having a layer structure of TR-E314/Li$_2$O/TR-E314/LG-101 was placed thereon with a layer thickness of 15 nm. Next, the hole transport layer 3, the red region light emitting layer 23 (phosphorescence), the second green region light emitting layer 24 (phosphorescence), and the electron transport layer 4 were successively formed so that each layer has a maximum film thickness of 50 nm. Subsequently, an electron injection layer constituted by a Li film and the second electrode 16 constituted by an Al film were successively formed. The thickness of the red region light emitting layer 23 was 2.5 nm, and the thickness of the second green region light emitting layer 24 was 40 nm.

The peak wavelength of the emission spectrum of the dopant in the blue region light emitting layer 21 was 450 nm, the peak wavelength of the emission spectrum of the dopant in the second green region light emitting layer 24 was 563 nm, and the peak wavelength of the emission spectrum of the dopant in the red region light emitting layer 23 was 620 nm.

The peak intensity proportion of blue (450 nm): green (563 nm): red (623 nm) in the emission spectrum of light emitted from the organic electroluminescent element 1 at an element temperature of 30° C. was 1:1.5:2.5.

Figure 8:
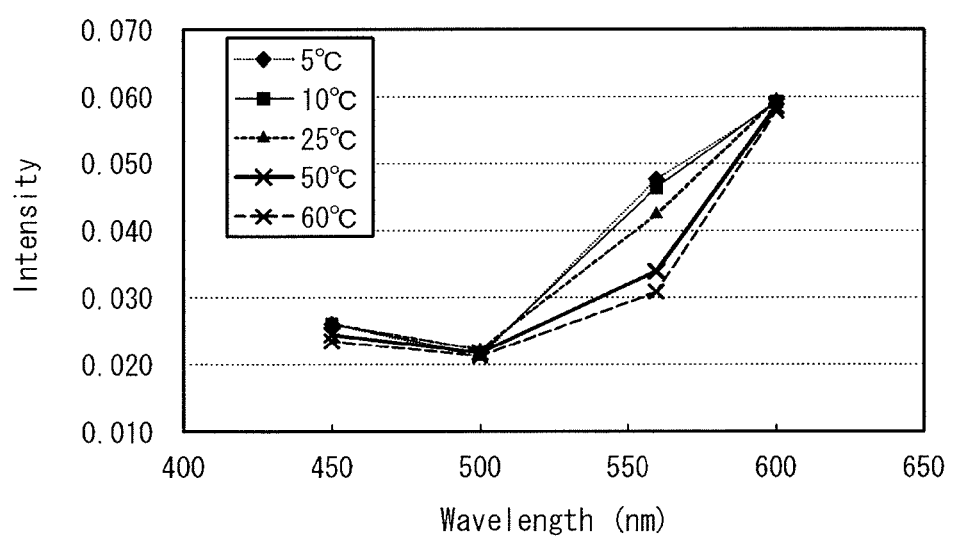
FIG. 8 is a graph showing change with temperature in emission intensity for an organic electroluminescent element in the first example of the present invention at wavelengths of 450 nm corresponding to a peak position of a color matching function X, 560 nm corresponding to a peak position of a color matching function Y, 600 nm corresponding to a peak position of a color matching function Z, and 500 nm corresponding to a valley position located between the peaks.

Also, FIG. 8 shows the changes with temperature in the emission intensities of the organic electroluminescent element 1 at wavelengths of 450 nm corresponding to a peak position of the color matching function X, 560 nm corresponding to a peak position of the color matching function Y, 600 nm corresponding to a peak position of the color matching function Z, and 500 nm corresponding to a valley position between the peaks in XYZ color matching functions that are important for color rendering properties.

The change with temperature in spectrum intensity around a Y peak wavelength 560 nm of the color matching functions is increased as a result of selecting the thicknesses, concentrations of dopant, etc. of the red region light emitting layer 23 and the second green region light emitting layer 24. The Y peak wavelength of the color matching functions corresponds to the position of the wavelength at which the luminosity factor it maximized. In short, the numerical values of color rendering properties can be adjusted to be designed values, by mainly controlling the intensity of the spectrum at 560 nm. The intensity proportion at wavelengths corresponding to peak positions of the color matching functions XYZ, etc. need only to be designed by appropriately selecting the types of dopant, the concentration of dopant, the thickness of the light emitting layer 2 and the like, and the charge mobility of the light emitting layer 2, for instance.

The spectrum, the various color rendering properties, and the color of light emitted from the organic electroluminescent element 1 at an element temperature of 5 to 60° C. were measured using a spectral radiance meter (CS-2000), and the obtained results were as follows.

FIG. 9 shows relative values (normalized such that the intensity at 25° C. is equal to 1) of intensities of the peaks of blue (450 nm): green (563 nm): red (623 nm) in the emission spectrum of light emitted from the organic electroluminescent element 1 at various element temperatures. When the element temperature increases, the intensity of the peak of green changes the most, and decreases the most at a high temperature.

FIG. 10 shows the relationship between the green peak intensity and the general color rendering index Ra. When both are approximated with a quadratic function, the correlation coefficient is 91%, and hence they are highly correlated. When similar approximation is performed on red and blue peak intensities, the correlation coefficient for red is 56% and the correlation coefficient for blue is 81%. Accordingly, the correlation between the green peak intensity and the general color rendering index Ra is high.

Similar plotting was carried out with regard to the special color rendering index R10 (yellow), the special color rendering index R11 (green), the special color rendering index R12 (blue), and the special color rendering index R13 (Caucasian complexion) to calculate correlation coefficients. The result thereof is shown in TABLE 1. This result shows that, for all of the special color rendering index R10, the special color rendering index R11, the special color rendering index R12, and the special color rendering index R13, the correlation coefficient with the green peak intensity is high. Therefore, according to the configuration of the present example, the temperature dependencies of various color rendering properties can be easily adjusted by optimizing the temperature dependency of green peak intensity.

As shown in TABLE 1, the general color rendering index Ra has a high value of 85 or greater in a wide range of 5° C. to 60° C. This is realized by the organic electroluminescent element 1 according to the present example including the fluorescent first green region light emitting layer 22 and the phosphorescent second green region light emitting layer 24, and by utilizing the temperature dependencies of these emission intensities. The general color rendering index Ra has a peak at the element temperature of 25° C., and the value of the general color rendering index Ra is significantly high at 95. The difference between the maximum and the minimum of the general color rendering index Ra is about 10% in the range of 5° C. to 60° C., and the absolute value of the general color rendering index Ra is 86 (60° C.) at the lowest, and stable and high color rendering properties are obtained.

Also, the special color rendering index R10, the special color rendering index R11, the special color rendering index R12, and the special color rendering index R13 have the maximum around an element temperature of 25° C., similarly to the general color rendering index Ra.

Further, in the range of 5° C. to 25° C., for the general color rendering index Ra and all of the special color rendering index R10, the special color rendering index R11, the special color rendering index R12, and the special color rendering index R13, the proportion of the minimum to the maximum is 0.85 to 0.95, and the fluctuation ranges of these indexes are significantly narrow and the minimum is greater than or equal to 71 for all of them.

Furthermore, the magnitudes of the indexes at an element temperature of 5° C. satisfy the relationship of R13>R11>R10>R12.

As describe above, with the present example, the general color rendering index Ra is particularly high at room temperature, and from a low temperature to room temperature, necessary special color rendering indexes satisfy the magnitude relationship that corresponds to the priority, and those values are high.

obtain effects that the element can be used in common, and development cost can be reduced, and therefore the production cost can be reduced and the standardization of lighting apparatuses can be promoted.

Second Example

The first electrode 15 was formed by forming ITO into a film having a thickness of 130 nm on the glass substrate 14. Furthermore, a hole injection layer made of PEDOT/PSS and having a thickness of 35 nm was formed on the first electrode 15 with a wet method. Subsequently, the hole transport layer 3, the blue region light emitting layer 21 (fluorescence), the first green region light emitting layer 22 (fluorescence), and the electron transport layer 4 were successively formed so as to each have a thickness of 5 nm to 60 nm, with a vapor deposition method. Next, the interlayer 13 having a layer structure of Alq3/Li$_2$O/Alg3/HAT-CN6 was placed thereon with a layer thickness of 15 nm. Next, the hole transport layer 3, the red region light emitting layer 23 (phosphorescence), the second green region light emitting layer 24 (phosphorescence), and the electron transport layer 4 were successively formed so that each layer has a maximum film thickness of 50 nm. Subsequently, an electron injection layer constituted by a Li film and the second electrode 16 constituted by an Al film were successively formed. The thickness of the red region light emitting layer 23 was 5 nm, and the thickness of the second green region light emitting layer 24 was 40 nm. With this process, the organic electroluminescent element 1 was prepared.

TABLE 1

| | | Element temperature | | | | | Correlation coefficient | | |
|---|---|---|---|---|---|---|---|---|---|
| | | 5° C. | 10° C. | 25° C. | 50° C. | 60° C. | Red | Green | Blue |
| General color rendering index | Ra | 89.4 | 90.6 | 94.6 | 89.4 | 86.5 | 57.6 | 91.5 | 80.7 |
| Special color rendering index | R10 | 82.7 | 85.2 | 95.2 | 84.5 | 77.1 | 50.4 | 92.5 | 76.0 |
| | R11 | 87.7 | 90.0 | 98.3 | 85.5 | 80.3 | 66.0 | 88.7 | 83.6 |
| | R12 | 71.5 | 74.2 | 83.9 | 76.3 | 66.1 | 34.7 | 97.9 | 34.7 |
| | R13 | 91.5 | 93.0 | 99.2 | 89.4 | 85.7 | 68.2 | 87.7 | 84.0 |

TABLE 2 shows the chromaticity u' and v', and color temperatures in the cases where the element temperature is 5° C. and 25° C. in the element according to the present example.

TABLE 2

| | | Color temperature (K) | Chromaticity u' | Chromaticity v' |
|---|---|---|---|---|
| Element temperature | 5° C. | 3100 | 0.24 | 0.525 |
| | 25° C. | 3000 | 0.25 | 0.520 |

Also, with regard to the chromaticity, when the temperature is decreased down to 5° C., u' is decreased and v' is increased. Further the color temperature is increased at a low temperature. Hence, the element according to the present example is capable of emitting light that gives the impression of cleanliness at a low temperature.

Figure 11:
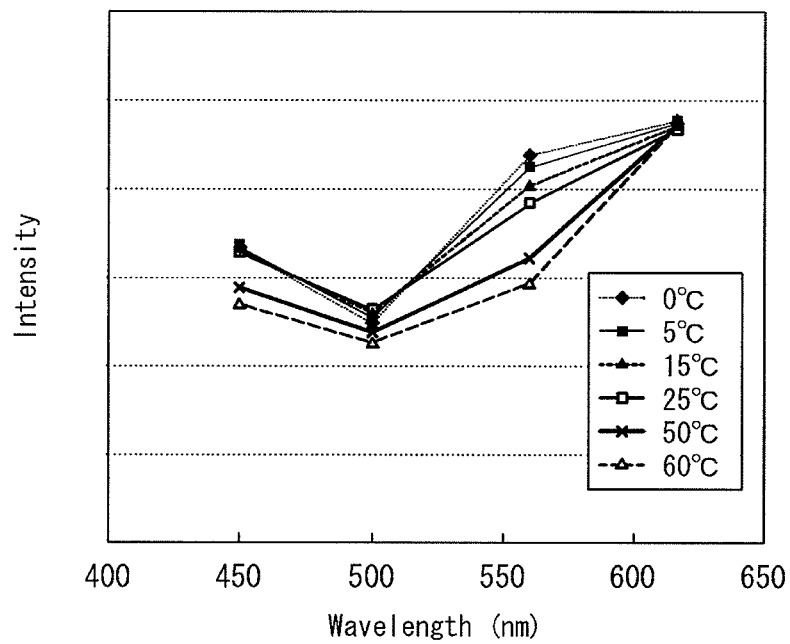
FIG. 11 is a graph showing change with temperature in emission intensity for an organic electroluminescent element in the second example of the present invention at wavelengths of 450 nm corresponding to a peak position of a color matching function X, 560 nm corresponding to a peak position of a color matching function Y, 616 nm corresponding to a peak position of a color matching function Z, and 500 nm corresponding to a valley position located between the peaks.

As obvious from the above, with using the organic electroluminescent element of the present example, it is possible to realize a high general color rendering index Ra suitable for indoor lighting. Also, the same element can be used for the purpose of improving the appearance of foods and dishes in a low temperature environment. In other words, it is possible to FIG. 11 shows the changes with temperature in the emission intensities of the organic electroluminescent element 1 at wavelengths of 450 nm corresponding to the peak position of the color matching function X, 560 nm corresponding to the peak position of the color matching function Y, 616 nm corresponding to the peak position of the color matching function Z, and 500 nm corresponding to the valley position between the peaks in XYZ color matching functions that are important for color rendering properties.

Further, the peak intensity proportion of blue (450 nm): green (563 nm): red (623 nm) in the emission spectrum of light emitted from the organic electroluminescent element 1 at an element temperature of 30° C. was 1:1.1:1.3.

The spectrum, the various color rendering properties, and the color of light emitted from the organic electroluminescent element 1 at an element temperature of 0 to 60° C. were measured using a spectral radiance meter (CS-2000) and the obtained results were as follows.

Figure 12:
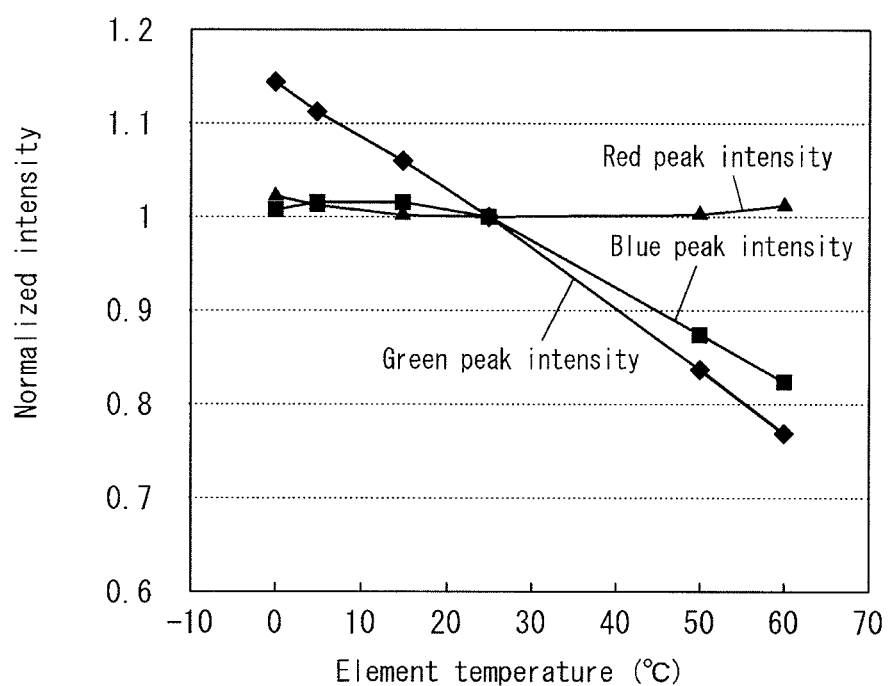
FIG. 12 is a graph showing the temperature dependency of intensities of peaks of blue, green, and red in the emission spectrum of light emitted from the organic electroluminescent element in the second example.

FIG. 12 shows relative values (normalized such that the intensity at 25° C. is equal to 1) of intensities of the peaks of blue (450 nm):green (563 nm):red (623 nm) in the emission spectrum of light emitted from the organic electroluminescent element 1 at various element temperatures. When the element temperature increases, the intensity of the peak of green changes the most, and decreases the most at a high temperature.

As shown in TABLE 3, the general color rendering index Ra has a high value in a wide range of 5° C. to 60° C. This is realized by the organic electroluminescent element 1 according to the present example including the fluorescent first green region light emitting layer 22 and the phosphorescent second green region light emitting layer 24, and by utilizing the temperature dependencies of these emission intensities.

Further, in the range of 5° C. to 25° C., for the general color rendering index Ra and all of the special color rendering index R10, the special color rendering index R11, the special color rendering index R12, and the special color rendering index R13, the fluctuation ranges of differences between the minimum and the maximum of these indexes are significantly narrow.

Furthermore, the magnitudes of the indexes at an element temperature of 5° C. satisfy the relationship of R13>R10>R11>R12.

As describe above, with the present example, the general color rendering index Ra is particularly high at room temperature, and from a low temperature to room temperature, necessary special color rendering indexes satisfy the magnitude relationship that corresponds to the priority, and those values are high.

TABLE 3

| | | Element temperature | | | | | | | |
|---|---|---|---|---|---|---|---|---|---|
| | | 0° C. | 5° C. | 10° C. | 15° C. | 20° C. | 30° C. | 50° C. | 60° C. |
| General color rendering index | Ra | 89.1 | 90.1 | 91.1 | 91.9 | 92.9 | 94.1 | 93.4 | 91.6 |
| Special color rendering index | R10 | 87.0 | 89.1 | 91.2 | 92.9 | 95.2 | 97.7 | 90.2 | 84.2 |
| | R11 | 81.2 | 83.2 | 85.3 | 86.9 | 89.3 | 92.9 | 96.4 | 92.1 |
| | R12 | 67.7 | 69.1 | 70.6 | 71.8 | 73.5 | 76.2 | 80.1 | 78.8 |
| | R13 | 90.5 | 91.9 | 93.3 | 94.5 | 96.2 | 98.2 | 93.5 | 89.5 |

TABLE 4 shows the chromaticity u' and v', and color temperatures in the cases where the element temperature is 5° C. and 25° C. in the element according to the present example.

TABLE 4

| | | Chromaticity u' | Chromaticity v' | Color temperature (K) |
|---|---|---|---|---|
| Element temperature | 5° C. | 0.221 | 0.508 | 4060 |
| | 25° C. | 0.221 | 0.505 | 4110 |

This shows that the color temperature of the light is lower in the case where the element temperature is 5° C. than in the case where the element temperature is 25° C.

As obvious from the above, with using the organic electroluminescent element of the present example, it is possible to realize a high general color rendering index Ra suitable for indoor lighting. Also, the same element can be used for the purpose of improving the appearance of foods and dishes in a low temperature environment. In other words, it is possible to obtain effects that the element can be used in common, and development cost can be reduced, and therefore the production cost can be reduced and the standardization of lighting apparatuses can be promoted.

Third Example

The first electrode 15 was formed by forming ITO into a film having a thickness of 130 nm on the glass substrate 14. Furthermore, a hole injection layer made of PEDOT/PSS and having a thickness of 35 nm was formed on the first electrode 15 with a wet method. Subsequently, the hole transport layer 3, the blue region light emitting layer 21 (fluorescence), the first green region light emitting layer 22 (fluorescence), and the electron transport layer 4 were successively formed so as to each have a thickness of 5 nm to 60 nm, with a vapor deposition method. Next, the interlayer 13 having a layer structure of Alq3/Li$_2$O/Alg3/HAT-CN6 was placed thereon with a layer thickness of 15 nm. Next, the hole transport layer 3, the red region light emitting layer 23 (phosphorescence), the second green region light emitting layer 24 (phosphorescence), and the electron transport layer 4 were successively formed so that each layer has a maximum film thickness of 50 nm. Subsequently, an electron injection layer constituted by a Li film and the second electrode 16 constituted by an Al film were successively formed. The thickness of the red region light emitting layer 23 was 2 nm, and the thickness of the second green region light emitting layer 24 was 40 nm. With this process, the organic electroluminescent element 1 was prepared.

Figure 13:
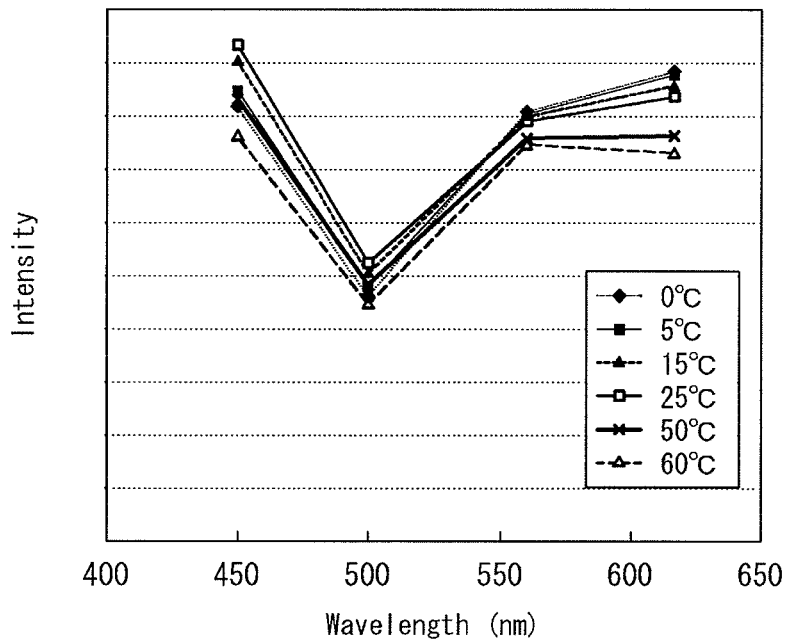
FIG. 13 is a graph showing change with temperature in emission intensity for an organic electroluminescent element in the third example of the present invention at wavelengths of 450 nm corresponding to a peak position of a color matching function X, 560 nm corresponding to a peak position of a color matching function Y, 616 nm corresponding to a peak position of a color matching function Z, and 500 nm corresponding to a valley position located between the peaks.

FIG. 13 shows the changes with temperature in the emission intensities of the organic electroluminescent element 1 at wavelengths of 450 nm corresponding to the peak position of the color matching function X, 560 nm corresponding to the peak position of the color matching function Y, 616 nm corresponding to the peak position of the color matching function Z, and 500 nm corresponding to the valley position between the peaks in XYZ color matching functions that are important for color rendering properties.

The peak intensity proportion of blue (450 nm): green (563 nm) red (623 nm) in the emission spectrum of light emitted from the organic electroluminescent element 1 at an element temperature of 30° C. was 1:0.8:0.9.

The spectrum, the various color rendering properties, and the color of light emitted from the organic electroluminescent element 1 at an element temperature of 0 to 60° C. were measured using a spectral radiance meter (CS-2000), and the obtained results were as follows.

Figure 14:
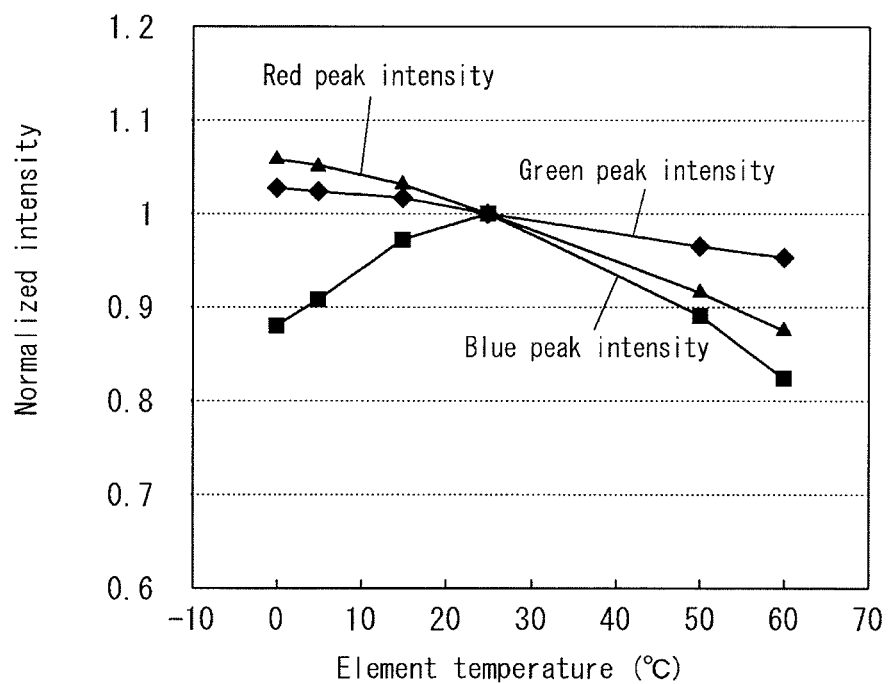
FIG. 14 is a graph showing the temperature dependency of intensities of peaks of blue, green, and red in the emission spectrum of light emitted from the organic electroluminescent element in the third example.

FIG. 14 shows relative values (normalized such that the intensity at 25° C. is equal to 1) of intensities of the peaks of blue (450 nm): green (563 nm): red (623 nm) in the emission spectrum of light emitted from the organic electroluminescent element 1 at various element temperatures. When the element temperature increases, the intensity of the peak of red changes the most, and decreases the most at a high temperature.

As shown in TABLE 5, the general color rendering index Ra has a high value in a wide range of 5° C. to 60° C. This is realized by the organic electroluminescent element 1 according to the present example including the fluorescent first green region light emitting layer 22 and the phosphorescent second green region light emitting layer 24, and by utilizing the temperature dependencies of these emission intensities.

Further, in the range of 5° C. to 25° C., for the general color rendering index Ra and all of the special color rendering index R10, the special color rendering index R11, the special color rendering index R12, and the special color rendering index R13, the fluctuation ranges of differences between the minimum and the maximum of these indexes are significantly narrow.

Furthermore, the magnitudes of the indexes at a temperature of 5° C. satisfy the relationship of R13>R10>R11>R12.

As describe above, with the present example, the general color rendering index Ra is particularly high at room temperature, and from a low temperature to room temperature, necessary special color rendering indexes satisfy the magnitude relationship that corresponds to the priority, and those values are high.

TABLE 5

| | | \multicolumn{8}{c}{Element temperature} |
|---|---|---|---|---|---|---|---|---|---|
| | | 0° C. | 5° C. | 10° C. | 15° C. | 20° C. | 30° C. | 50° C. | 60° C. |
| General color rendering index | Ra | 90.3 | 90.6 | 90.8 | 90.9 | 90.9 | 90.7 | 89.1 | 87.6 |
| Special color rendering index | R10 | 91.3 | 92.8 | 94.3 | 95.6 | 96.5 | 96.5 | 90.4 | 86.2 |
| | R11 | 80.3 | 81.0 | 81.6 | 82.0 | 82.3 | 82.0 | 78.9 | 76.6 |
| | R12 | 67.6 | 68.0 | 68.3 | 68.5 | 68.6 | 68.4 | 66.0 | 63.9 |
| | R13 | 94.3 | 95.0 | 95.7 | 96.3 | 96.7 | 96.5 | 92.9 | 90.3 |

TABLE 6 shows the chromaticity u' and v', and color temperatures in the cases where the element temperature is 5° C. and 25° C. in the element according to the present example.

TABLE 6

| | | Chromaticity u' | Chromaticity v' | Color temperature (K) |
|---|---|---|---|---|
| Element temperature | 5° C. | 0.217 | 0.494 | 4500 |
| | 25° C. | 0.213 | 0.488 | 4800 |

This shows that the values of u' and v' are greater in the case where the element temperature is 5° C. than in the case where the element temperature is 25° C. Further, this shows that the color temperature of the light is lower in the case where the element temperature is 5° C. than in the case where the element temperature is 25° C.

As obvious from the above, with using the organic electroluminescent element of the present example, it is possible to realize a high general color rendering index Ra suitable for indoor lighting. Also, the same element can be used for the purpose of improving the appearance of foods and dishes in a low temperature environment. In other words, it is possible to obtain effects that the element can be used in common, and development cost can be reduced, and therefore the production cost can be reduced and the standardization of lighting apparatuses can be promoted.

REFERENCE SIGNS LIST

1 Organic electroluminescent element
2 Light emitting layer
3 Lighting fixture

The invention claimed is:

1. An organic electroluminescent element, comprising:
   a first light emitting layer, including a first green region light emitting layer,
   a second light emitting layer, including a second green region light emitting layer, and
   an interlayer interposed between the first light emitting layer and the second light emitting layer,
   the organic electroluminescent element having such characteristics that:
   a maximum of a general color rendering index Ra in an element temperature range of 5° C. to 60° C., is present in an element temperature range of 15° C. to 35° C.; and,
   at least one of maxima of special color rendering indexes R10, R11, R12, and R13 in the element temperature range of 5° C. to 60° C., is present in an element temperature range of 5° C. to 35° C.

2. The organic electroluminescent element according to claim 1, wherein
   at least one of the maxima of the special color rendering indexes R10, R11, R12, and R13 in the element temperature range of 5° C. to 60° C. is present in an element temperature range of 15° C. to 35° C.

3. The organic electroluminescent element according to claim 1, wherein
   in values of u' and v' in a u', v' chromaticity diagram of a color of light emitted from the organic electroluminescent element in a direction identical to a direction in which the first light emitting layer, the second light emitting layer and the interlayer are stacked, the value of u' increases more and the value of v' increases more when the element temperature is 5° C. than when the element temperature is 25° C.

4. The organic electroluminescent element according to claim 1 wherein
   a color temperature of light is lower when the element temperature is 5° C. than when the element temperature is 25° C.

5. The organic electroluminescent element according to claim 1, wherein
   at least one of the general color rendering index Ra, and the special color rendering indexes R10, R11, R12, and R13 is equal to 70 or more in an element temperature range of 5° C. to 25° C., and
   a ratio of a minimum to a maximum for each of the at least one of the general color rendering index Ra, and the special color rendering indexes R10, R11, R12, and R13 in the element temperature range of 5° C. to 25° C. is equal to 0.8 or more.

6. The organic electroluminescent element according to claim 1, wherein:

at the element temperature of 5° C., the special color rendering index R13 is larger than the special color rendering index R10, and the special color rendering index R10 is larger than the special color rendering index R12;

at the element temperature of 5° C., the special color rendering index R13 is larger than the special color rendering index R11 and the special color rendering index R11 is larger than the special color rendering index R12; and at the element temperature of 5° C., the special color rendering index R13 is larger than the general color rendering index Ra and the general color rendering index Ra is larger than the special color rendering index R12.

7. The organic electroluminescent element according to claim 1, wherein
in values of u' and v' in a u', v' chromaticity diagram of a color of light emitted from the organic electroluminescent element in a direction identical to a direction in which the first light emitting layer, the second light emitting layer and the interlayer are stacked, the value of u' decreases more and the value of v' increases more when the element temperature is 5° C. than when the element temperature is 25° C.

8. The organic electroluminescent element according to claim 1, wherein
a color temperature of light is higher when the element temperature is 5° C. than when the element temperature is 25° C.

9. The organic electroluminescent element according to claim 1,
wherein at least one of the first green region light emitting layer and the second green region light emitting layer contains a phosphorescent dopant.

10. The organic electroluminescent element according to claim 1, wherein
the first light emitting layer further comprises a red region light emitting layer the first green region light emitting layer contains a phosphorescent dopant, the red region light emitting layer and the first green region light emitting layer are stacked, and, wherein the red region light emitting layer has a thickness less than a thickness of the first green region light emitting layer.

11. The organic electroluminescent element according to claim 10, wherein
a ratio of the thickness of the red region light emitting layer to the thickness of the first green region light emitting layer is in a range of 2 to 15%.

12. The organic electroluminescent element according to claim 1, further comprising:
a first light emitting unit including the first green region light emitting layer; and
a second light emitting unit including the second green region light emitting layer;
wherein the interlayer interposed between the first light emitting unit and the second light emitting unit.

13. A lighting fixture comprising the organic electroluminescent element according to claim 1.

14. A food storage device, comprising:
a storage configured to store food; and
the lighting fixture according to claim 13 configured to illuminate an interior of the storage.

15. The organic electroluminescent element according to claim 1, wherein
the interlayer provides at least one of an equipotential surface and a charge generation layer.

* * * * *